United States Patent
Fling et al.

(10) Patent No.: US 7,079,591 B2
(45) Date of Patent: Jul. 18, 2006

(54) METHOD AND SYSTEM FOR RECOVERING INFORMATION FROM A MAGNETIC FIELD SIGNAL USABLE FOR LOCATING AN UNDERGROUND OBJECT

(75) Inventors: Richard W. Fling, Saltford (GB); Luigi Lanfranchi, Coxley Near Wells (GB)

(73) Assignee: Radiodetection Limited, Bristol (GB)

( * ) Notice: Subject to any disclaimer, the term of this patent is extended or adjusted under 35 U.S.C. 154(b) by 747 days.

(21) Appl. No.: 09/918,724

(22) Filed: Aug. 1, 2001

(65) Prior Publication Data

US 2003/0058961 A1    Mar. 27, 2003

(51) Int. Cl.
*H03K 9/00* (2006.01)
*H03D 3/24* (2006.01)

(52) U.S. Cl. ................................ 375/316; 375/376

(58) Field of Classification Search ............... 375/316, 375/376, 344, 321, 327; 329/325, 360; 327/147; 348/731; 342/357.01, 357.06
See application file for complete search history.

(56) References Cited

U.S. PATENT DOCUMENTS

| | | | |
|---|---|---|---|
| 4,185,243 A | 1/1980 | Brown | 325/364 |
| 4,606,075 A | 8/1986 | Eastmond | 455/234 |
| 4,642,573 A * | 2/1987 | Noda et al. | 329/308 |
| 5,600,680 A | 2/1997 | Mishima et al. | 375/327 |
| 6,140,819 A | 10/2000 | Peterman et al. | 324/326 |
| 6,313,782 B1 * | 11/2001 | Lehan et al. | 342/16 |
| 2003/0008628 A1 * | 1/2003 | Lindell et al. | 455/180.1 |

FOREIGN PATENT DOCUMENTS

| | | |
|---|---|---|
| EP | 0425267 A2 | 10/1990 |
| WO | 95/18508 | 12/1994 |

OTHER PUBLICATIONS

International Search Report dated Aug. 6, 2003.

* cited by examiner

*Primary Examiner*—Khai Tran
(74) *Attorney, Agent, or Firm*—Baker & Hostetler LLP

(57) ABSTRACT

A data recovery subsystem for use in a receive system configured to receive a magnetic field signal, the magnetic field signal including a carrier component usable for locating an underground object and at least one modulation sideband. The data recovery subsystem includes a first mixer to mix a Radio Frequency (RF) signal with a first Local Oscillator (LO) signal to produce an Intermediate Frequency (IF) signal representative of the magnetic field signal. A Phase Locked Loop (PLL) phase-locks a second LO signal to an IF carrier component of the IF signal. A second mixer synchronously mixes the IF signal with the second LO signal to produce a baseband signal including a demodulated sideband.

20 Claims, 22 Drawing Sheets

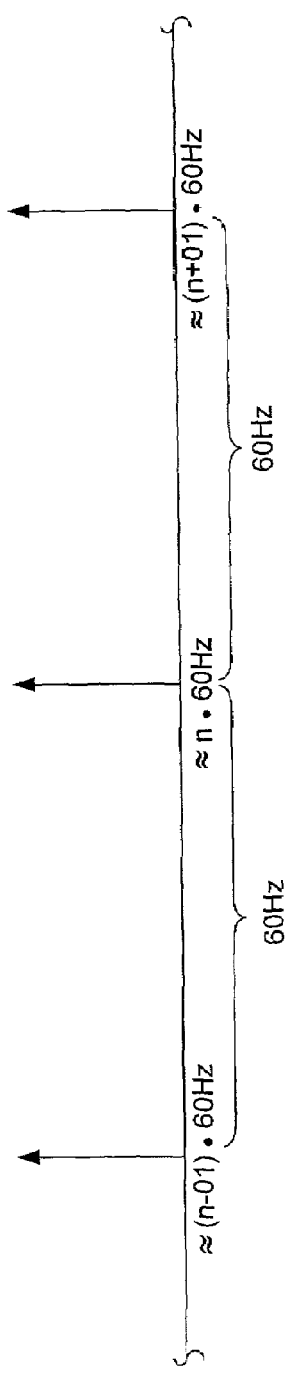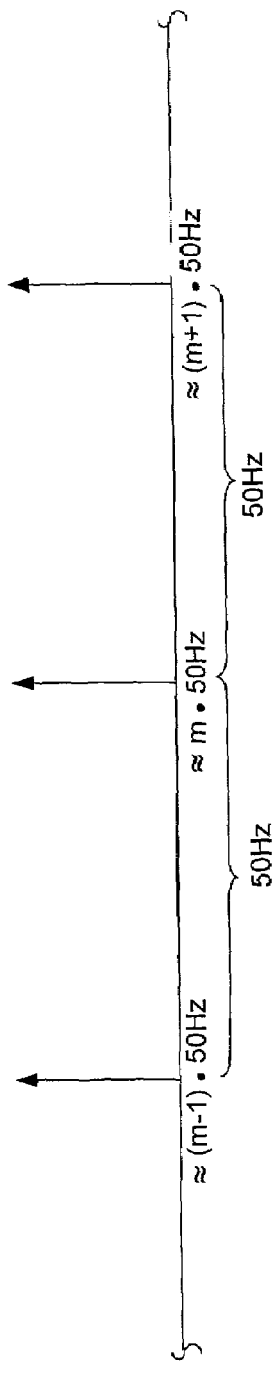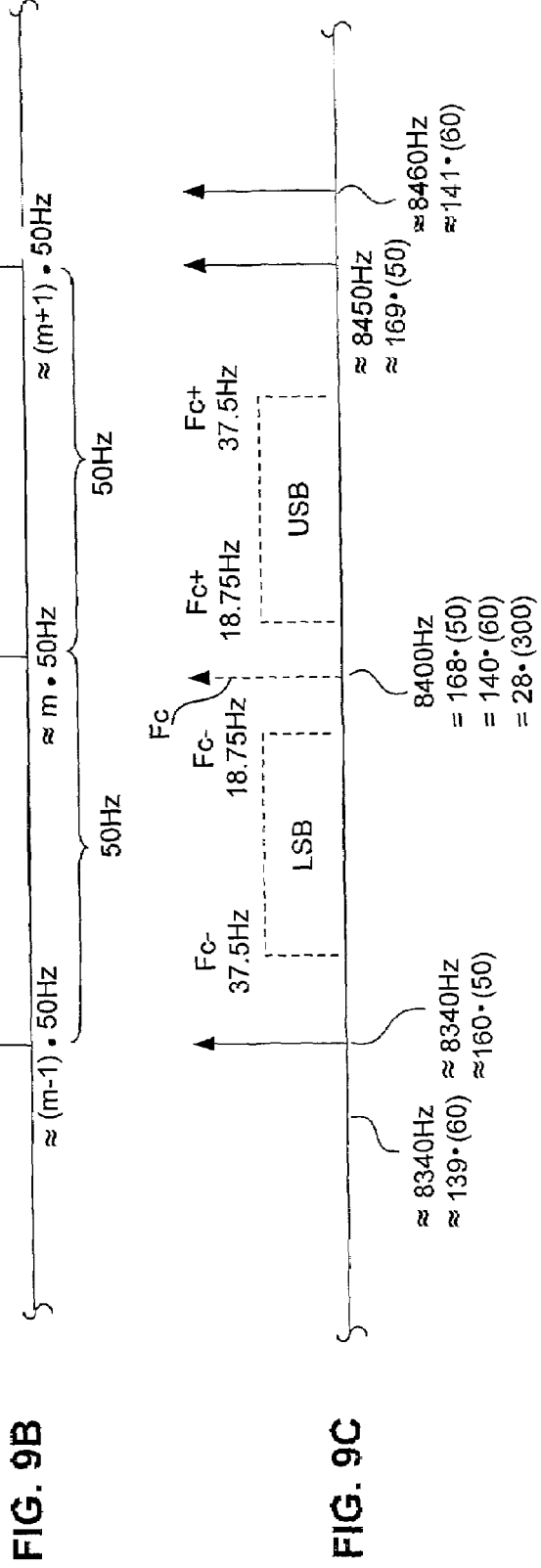
FIG. 9A
FIG. 9B
FIG. 9C

METHOD AND SYSTEM FOR RECOVERING INFORMATION FROM A MAGNETIC FIELD SIGNAL USABLE FOR LOCATING AN UNDERGROUND OBJECT

FIELD OF THE INVENTION

The present invention is directed to a method and system for recovering information from a magnetic field signal, the magnetic field signal including a magnetic field carrier component usable for locating an underground object such as a boring tool, and at least one magnetic field signal modulation sideband that conveys the information to be recovered.

BACKGROUND OF THE INVENTION

Several guided and unguided sub-surface (i.e., underground) boring tools are currently on the market. Guided tools require substantially continuous location and orientation monitoring to provide necessary steering information. To monitor such an underground tool it is necessary to track the sub-surface location of the tool. Only once the location of the tool is located can a proper depth measurement be obtained, for example, from a measuring position directly above the head of the boring tool which houses a transmitter. Unguided tools would also benefit from periodic locating or substantially continuous monitoring, for example, in prevention of significant deviation from planned tool pathways and close tool approaches to utilities or other sub-surface obstructions.

One method for locating such sub-surface boring tools includes mounting a magnetic field source on the boring tool and detecting the magnetic field from that field source. This field source can be, for example, a solenoid, or any equivalent transponder capable of generating the magnetic field. When alternating current flows through the solenoid a bipolar magnetic field is thereby generated, which can be detected at the surface by a monitoring device. A vertical component of the magnetic field at the surface will change direction when the monitoring device is directly above the solenoid, assuming the solenoid is horizontal. Therefore by noting the position in which that component of the field reverses, the position of the solenoid in a horizontal plane can be determined. If this is done continuously, the movement of the boring tool on which the solenoid is mounted can be tracked. The depth of the solenoid can also be gauged by measuring the attenuation of the field at the surface. This requires the field strength at the solenoid to be known.

As described above, determinations of the location of underground boring tools rely upon magnetic field measurements. Thus, the reliability and accuracy of such location determinations can be adversely affected when the magnetic field measurements are corrupted. More specifically, the location determinations can be adversely affected at the monitoring device. The primary sources of magnetic field interference in this environment are power distribution networks. Overhead and/or underground power lines of such power distribution networks produce harmonically derived interference signals at regular harmonic intervals of their fundamental frequencies, 50 Hz (±0.1 Hz) or 60 Hz (±0.1 Hz), through to well above 10 kHz. Besides adversely affecting the reliability and accuracy of location determinations, magnetic field interference can cause instability in location determinations calculated by the monitoring device, thereby causing a location display to appear unstable to an observer (i.e., user of the monitoring device). Accordingly, there is a need to reduce the effects of such interference, to thereby improve the reliability and accuracy of location determinations, and the stability of a display of the location.

It is often useful to know more than just the location of a boring tool. For example, it is often useful to know the orientation (e.g., yaw, pitch and/or roll) of the tool. To provide this information, the magnetic field generated (e.g., by the underground transponder) is modulated to impart modulated information thereon that can be demodulated and thus obtained (made available) at the monitoring device. Existing monitoring systems provide limited data throughput (i.e., data transmission bandwidth from the transponder to the monitoring device), in part due to the need to avoid data corruption by magnetic field interference. Therefore, there is a need to increase the data throughput that can be achieved in an environment that includes the interference described above. There is a related need to demodulate and thereby recover the modulated information conveyed by the magnetic field signal.

BRIEF SUMMARY OF THE INVENTION

The present invention is directed to a data recovery subsystem for use in a receive system configured to receive a magnetic field signal, the magnetic field signal including a carrier component usable for locating an underground object and at least one modulation sideband. According to an embodiment of the present invention, the data recovery subsystem includes a first mixer adapted to mix a Radio Frequency (RF) signal representative of the magnetic field signal with a first Local Oscillator (LO) signal to produce an Intermediate Frequency (IF) signal representative of the magnetic field signal. The IF signal includes an IF carrier component and an IF modulation sideband. The subsystem also includes a Phase Locked Loop (PLL) adapted to synchronize (for example, phase-lock) a second LO signal to the IF carrier component of the IF signal. The subsystem also includes a second mixer adapted to synchronously mix the IF signal with the second LO signal to produce a baseband signal including a demodulated sideband, the demodulated sideband corresponding to the modulation sideband of the magnetic field signal.

The above-mentioned PLL includes a PLL mixer adapted to derive an error signal representative of a phase difference between the IF carrier component of the IF signal and a feedback signal. The PLL also includes a filter adapted to filter the error signal to thereby produce a filtered error signal, a Voltage Controlled Oscillator (VCO) adapted to generate a VCO output signal responsive to the filtered error signal, and a feedback circuit adapted to derive the feedback signal and the second LO signal from the VCO output signal.

The present invention is also directed to a method of recovering data/information from a magnetic field signal. The method can be implemented using the data recovery subsystem described above.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 9A is an exemplary frequency domain plot of an interference signal (e.g., produced by an overhead or underground power line in the United States);

FIG. 9B is an exemplary frequency domain plot of an interference signal (e.g., produced by an overhead or underground power line in Europe);

FIG. 9C is an exemplary frequency domain plot that includes an interference signal (in solid line) that is in close proximity with a carrier signal frequency (in dashed line) (e.g., for interference produced by power lines in the United State or Europe);

DETAILED DESCRIPTION OF THE INVENTION

Figure 1:
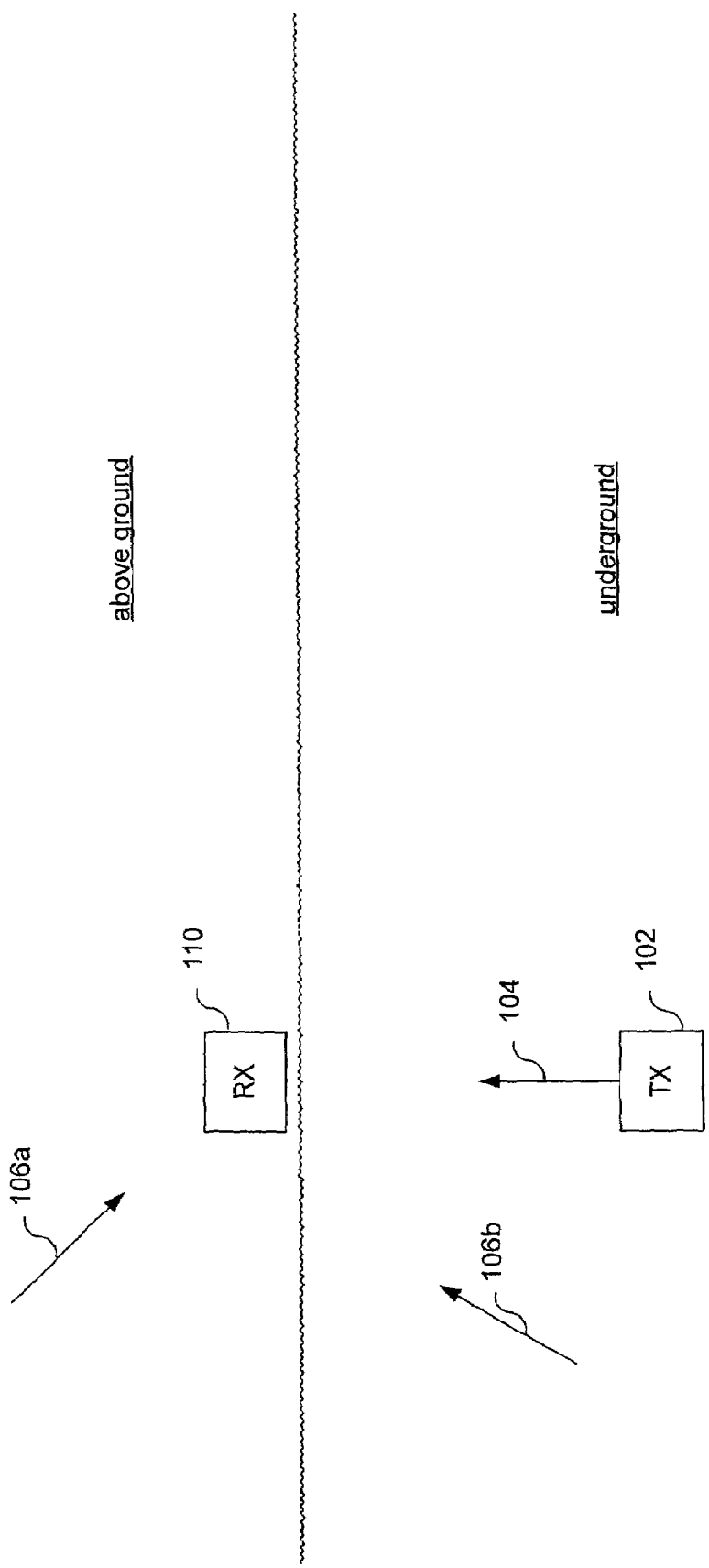
FIG. 1 illustrates an exemplary environment in which embodiments of the present invention are useful.

Prior to explaining specific details of the present invention, an exemplary environment where the present invention is useful will first be described. Referring to FIG. 1, an underground transmit device 102 transmits a magnetic field signal 104 that can be received by a receive/monitoring device 110. Transmit device 102 is typically mounted to, or integrally formed with, a boring/drilling tool (not shown in FIG. 1). Receive device 110 is typically part of, or in communications with, a monitoring device that monitors, among other things, a location of transmit device 102 (and thereby, a location of the boring tool). As will be explained below, receive device 110 determines the location of transmit device 102 based on a received magnetic field signal (including magnetic field signal 104 generated by transmit device 102). As will also be explained in more detail below, the monitoring device can determine additional information, when magnetic field signal 104 is modulated to convey such additional information.

In addition to receiving magnetic field signal 104, receive device 110 may also receive magnetic interference signals 106a and/or 106b, that may be produced by overhead and/or underground power lines (not shown). Additional details of such interference signal are discussed below.

Figure 2A:
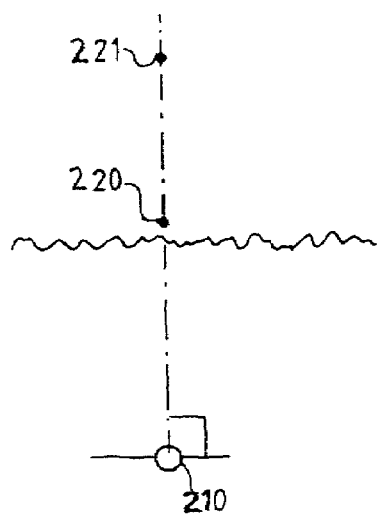
FIG. 2A shows an underground solenoid, viewed along the axis of the solenoid, and first and second measuring points.
Figure 2B:
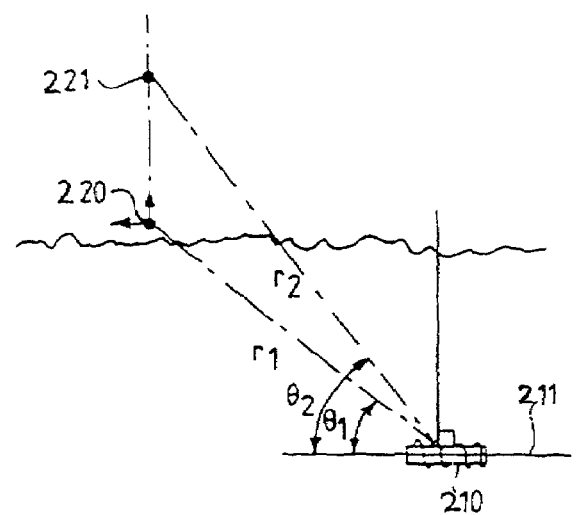
FIG. 2B is a side view of the same solenoid and measuring points of FIG. 2A.

Referring now to FIGS. 2A and 2B, transmit device 102 typically includes a solenoid 210 or other equivalent transponder that is driven to radiate magnetic field signal 104. An alternating electric current having a known magnitude is passed through the coils of solenoid 210. The flow of electric current through solenoid 210 generates a magnetic field (i.e., magnetic field signal 104). The carrier component of magnetic field strength at solenoid 210 itself can be measured before solenoid 210 is buried. As shown in FIG. 2B, solenoid 210 is arranged so that its axis 211 is horizontal. Also shown in FIGS. 2A and 2B are a first measuring point 220 and a second measuring point 221 at which magnetic field measurements are made above ground. Measuring points 220 and 221 are typically antennas of an antenna array (e.g., an antenna array 702, shown in FIG. 7). The antenna array is part of receive device 110.

These measuring points 220 and 221 lie in a vertical plane containing axis 211 of solenoid 210. Measuring points 220 and 221 as shown are positioned one above the other at a known vertical separation. The location of first measuring point 220 relative to solenoid 210 can be defined by a distance $r_1$ between them and the angle $\theta_1$ above the horizontal of solenoid 210 to first measuring point 220. The relative locations of second measuring point 221 and solenoid 210 are similarly defined by distance $r_2$ and angle $\theta_2$.

Figure 3:
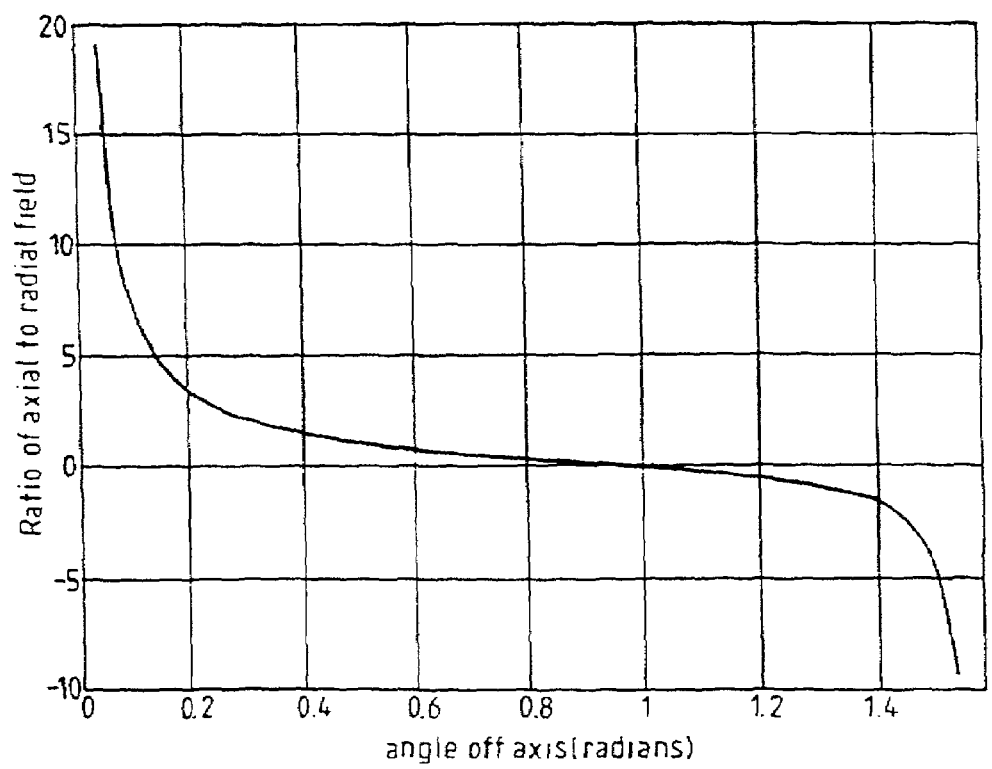
FIG. 3 is a graph showing the ratio of the axial component of the magnetic field at a measuring point to the radial component as a function of the angle between the axis of the solenoid and a line from the measuring point to the center of the solenoid.
Figure 7:
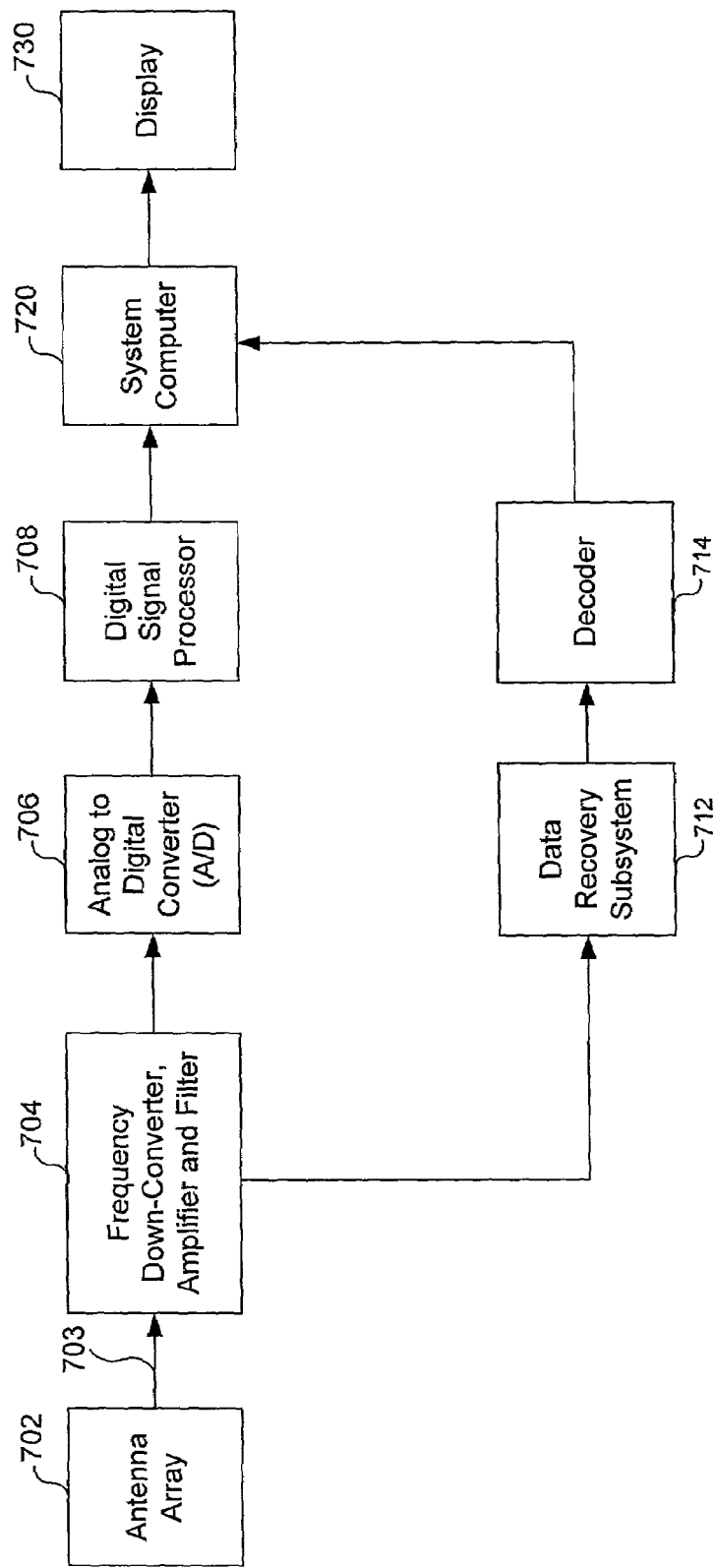
FIG. 7 illustrates an exemplary receive/monitoring device in which specific embodiment of the present invention can be used.

A horizontal component $f_h$ and a vertical component $f_v$ of the field strength are measured at first measuring point 220, and a ratio $f_h/f_v$ is calculated by a system computer (e.g., a system computer 720, shown in FIG. 7). The ratio $f_h/f_v$ is a function of angle $\theta_1$, and this function can be determined analytically and stored in a memory (not shown) of the system computer. The function is shown graphically in FIG. 3. It can be seen from FIG. 3 that the function is monotonic, that is, each value of the ratio $f_h/f_v$ corresponds to one and only one value of angle $\theta_1$. Therefore when the calculated value of the ratio $f_h/f_v$ is input to the system computer, the value of $\theta_1$ can be derived.

Similar measurements taken at the second measurement point 221 enable angle $\theta_2$ to be derived in the same way. Once these angles have been determined the distance between solenoid 210 and measuring points 220 and 221 could be derived by triangulation. Instead the absolute values of the field strength at measuring points 220 and 221 are measured, and since the field strength at the solenoid 210 itself is known this gives the attenuation of the field at measuring points 220 and 221. From the attenuation of the field, the distances $r_1$, $r_2$ between solenoid 210 and measuring points 220 and 221 can be calculated by a system computer (e.g., system computer 720, shown in FIG. 7). The attenuation varies both with the distances between the measuring points and the solenoid, and also the angles $\theta_1$ and $\theta_2$. However the angles $\theta_1$ and $\theta_2$ are known, and therefore the attenuation can be determined using, for example, a look-up table that relates attenuation and angle. Once the distances $r_1$, $r_2$ and angles $\theta_1$, $\theta_2$ have been determined, the location of solenoid 210 relative to measuring points 220 and 221 is now known. By averaging the results from the two measuring points 220 and 221 reliability can be increased and the effects of noise can be decreased.

In the above analysis the solenoid was horizontal and therefore the horizontal and vertical components $f_h$, $f_v$ correspond to the axial and radial components of the magnetic field, respectively. If the solenoid was not horizontal, then either the axial and radial components could be measured directly, or the vertical and horizontal components measured and then a correction made to determine the axial and radial components. Additional details of a method for locating an underground solenoid (and thus, an underground drilling tool) in the manner described above are disclosed in U.S. Pat. No. 5,917,325 to Smith, which is incorporated herein in its entirety by reference.

Figure 4:
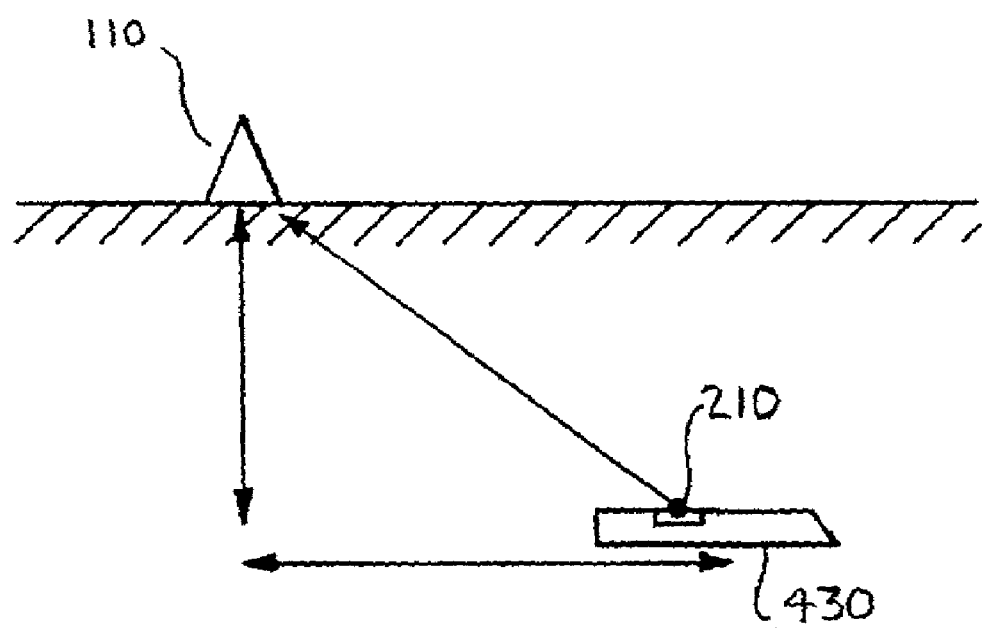
FIG. 4 is an illustration useful for showing how a subsurface boring tool can be located.

FIG. 4 shows the application of this principle to locating an underground boring tool 430. Solenoid 210 is mounted on boring tool 430 such that the axis of solenoid 210 is parallel to the normal motion of boring tool 430. In this way, as boring tool 430 burrows through the earth, solenoid 210 moves with boring tool 430 and continuous measurements of the type described above can be used to track the motion of boring tool 430. Receive device 110 (or multiple received devices 110) are located above ground. On the basis of the measurements of its location, boring tool 430 is controlled using conventional control methods.

It is often useful to know more than just the location of boring tool 430. For example, it is often useful to know the orientation (e.g., yaw, pitch and/or roll) of tool 430. To provide this information, the magnetic field generated by solenoid 210 is modulated to impart modulated information thereto that can be demodulated and thus obtained at a monitoring device (e.g., the same monitoring device used to track the location of underground boring tool 430).

Exemplary Transmit Device

Figure 5:
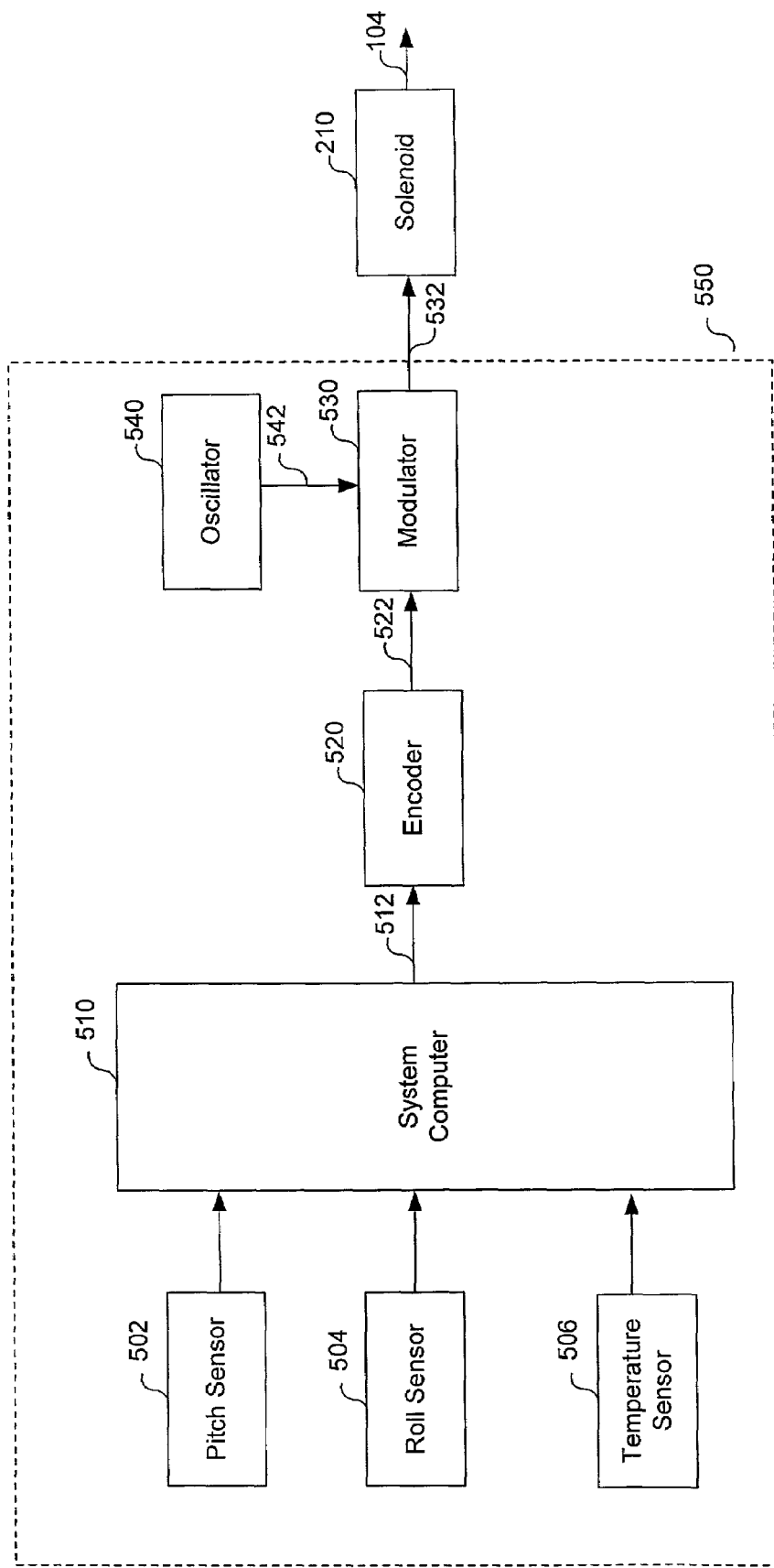
FIG. 5 illustrates an exemplary transmit device in which specific embodiments of the present invention can be used.

FIG. 5 illustrates exemplary details of transmit device 102 that can be used to transmit a modulated magnetic field signal. Solenoid 210 can be considered part of transmit device 102. Exemplary transmit device 102 includes a pitch sensor 502, a roll sensor 504 and a temperature sensor 506, all of which are known in the art. Digital output signals from sensors 502, 504 and 506 are multiplexed by a transmit system computer 510 (or by a multiplexer) to produce an information signal 512 provided to an encoder 520. Encoder 520 encodes information signal 512 to produce an encoded information signal 522. Additional details of an encoding scheme employed by encoder 520, according to embodiments of the present invention, are discussed below. A reference signal generator 540 (e.g., a local oscillator) produces a reference signal 542 that has a reference frequency. A modulator 530 modulates reference signal 542 with encoded information signal 530 at a predetermined bit rate (also referred to as a modulation rate) to produce a transponder drive signal 532. Accordingly, the above mentioned elements of transmit device 102 can be considered a subsystem 550 that produces drive signal 532.

Drive signal 532 includes a carrier component, having a frequency equal to the reference frequency, and at least one information sideband including sideband energy (an information sideband is also referred to as a modulation sideband because it arises as a result of modulating reference signal 542). Accordingly, the frequency of the carrier component is controlled by reference signal generator 542. The spectral shape (i.e., frequency spectrum) of the sideband(s) is a function of the bit rate and the encoding scheme of encoder 520, as will be explained in more detail below. Modulator 530 can perform amplitude modulation, such as Amplitude Shift Keying (ASK) or On-Off Keying (OOK), as would be apparent to one of ordinary skill in the art, to produce upper an lower information sidebands. Single sideband modulation schemes can alternatively be used, as would be apparent to one of ordinary skill in the art.

Figure 6:
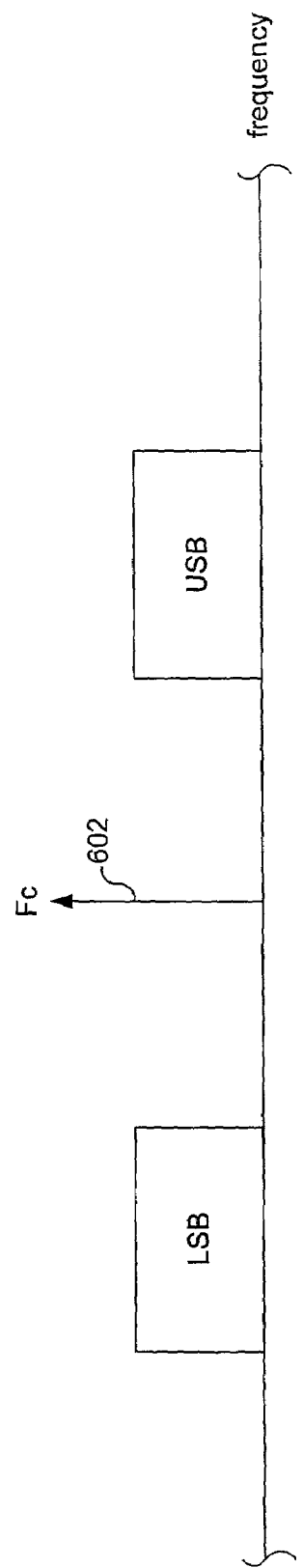
FIG. 6 is an exemplary frequency domain plot of a magnetic field signal produced by the transmit device of FIG. 5.

Drive signal 532 drives a transponder, such as solenoid 210, to thereby produce magnetic field signal 104. FIG. 6 is an exemplary frequency domain plot of magnetic field signal 104 produced by underground transmit device 102 (using ASK or OOK modulation). Magnetic field signal 104 includes a narrow band carrier component 602 at a carrier component frequency $F_c$ and upper and lower modulation sidebands. As just mentioned, the spectral shape of the upper information side band (USB) and the lower information side band (LSB) are functions of the encoding scheme and bit rate. This is described in more detail below.

Exemplary Receive Device

FIG. 7 illustrates exemplary details of receive device 106. Receive device 106 receives magnetic field signals (e.g., magnetic field signal 104) from transmit device 102 and determines locations based on carrier components of the signals. Exemplary receive device 106 includes an antenna array 702 (e.g., including antennas at locations 220 and 221), and a frequency down-converter, amplifier, and filter stage/module 704. Exemplary receive device 106 also includes an analog to digital converter (A/D) 706, a digital signal processor (DSP) 708, a receive system computer 720 (e.g., a microcontroller or microprocessor) and a display 730. Antenna array 702 detects magnetic field signal 104, and provides an RF signal 703 representative of the magnetic field signal to the next stage/module (signal conditioner 704). RF signal 703 includes an RF carrier component an at least one information sideband corresponding to the magnetic field signal. In an exemplary arrangement, RF signal 703 is frequency down-converted (e.g., shifted from about 8400 kHz down to about 6 Hz), amplified and filtered at stage/module 704, before being converted a digital signal by A/D 706. The resulting digital signal is then fed to DSP 708, which performs digital signal processing on the digital signal received from A/D 706. An output of DSP 708 is provided to receive system computer 720. System computer 720 performs the necessary calculations to generate a location output (e.g., using the process explained above) to be displayed on display 730. Display 730 is, for example, a liquid crystal display (LCD). Display 730 can include, for example, a compass graphic, forward and backward indicator arrows, and left and right indicator arrows.

Another output from frequency down-converter, amplifier, and filter stage/module 704 is provided to a data recovery stage/module 712, which performs, among other things, demodulation of the at least one information/modulation sideband. An output of data recovery stage/module 712 is provided to a decoder 714 which decodes encoded information in the information sideband(s) of signal 104/703. The decoded data is then provided to system computer 720, which generates additional outputs to be displayed on display 730 (e.g, temperature, pitch, etc.).

Figure 8:
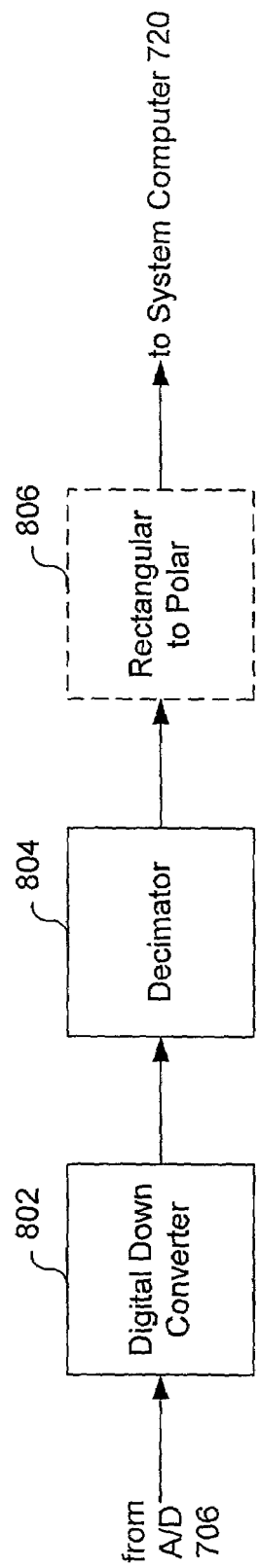
FIG. 8 illustrates additional details of the digital signal processor (DSP) stage/module of FIG. 7.

Exemplary details of DSP 708 are shown in FIG. 8. Exemplary DSP 708 includes a digital down converter 802 that mixes-down the digital signal received from A/D 706 to an almost direct current (DC) digital signal (e.g., having a frequency near zero Hz, and preferably, less than 0.25 Hz). The near DC digital signal is then decimated by a decimator 804, which filters and reduces the bit rate of the near DC digital signal (e.g., from 240 samples per second to 30 samples per second). Decimator 804 can include, for example, one or more finite impulse response (FIR) filters and/or one or more infinite impulse response (IIR) filters. If the digital signal received from A/D 706 includes inphase (I) and quadrature (Q) components (e.g., produced by a quadrature mixer of stage/module 704), then a rectangular-to-polar stage/module 806 is included to produce magnitude and phase components. DSP 708 provides samples to system computer 720 that are representative of detected magnetic field strength of the carrier component of the magnetic field signal. System computer 720 tracks the location of an underground transponder (e.g., solenoid 210) based on these sample (e.g., using the process described above).

Overview of the Present Invention

In the above described environment, determinations of the location of solenoid 210 (and thus boring tool 430) rely upon magnetic field strength measurements of the carrier component of a detected magnetic field signal. Thus, it is clear that the reliability and accuracy of such location determinations can be adversely affected when the magnetic field measurements are corrupted. Stated another way, the location determinations can be adversely affected if magnetic field strength measurements of magnetic field signal 104 are altered at measuring point 220 and/or measuring point 221 due to magnetic field interference. Magnetic field interference can be produced, for example, by overhead power lines and/or buried power lines. Besides affecting the reliability and accuracy of location determinations, interference can cause instability in location determinations calculated by receive system computer 720. An effect of this is that the solenoid location, as indicated on display 730, is unstable. For example, the compass graphic and/or left/right indicator arrows may appear unstable to an observer of display 730.

As mentioned above, the primary sources of magnetic field interference are power distribution networks that produce harmonically derived interference signals at regular 50 Hz (±0.1 Hz) or 60 Hz (±0.1 Hz) intervals from their fundamental frequency through to well above 10 kHz. More specifically, it is typically overhead power lines and/or buried power lines of a power distribution networks that produce such magnetic field interference. For example, power lines in the United States generally produce frequency comb lines at approximately 60 Hz intervals, as shown in FIG. 9A. Power lines in Europe generally produce frequency comb lines at approximately 50 Hz intervals, as shown in FIG. 9B. Power lines in other areas of the world typically produce interference signals that are similar to those in either Europe or the United States.

Embodiments of the present invention are directed to reducing (and preferably cancelling) such interference, to thereby improve the reliability and accuracy of location determinations, and the stability of a display of the location (e.g., on display 730).

Further embodiments of the present invention are directed to increasing (and preferably maximizing) the data throughput (i.e., of transmit device 102) that can be achieved in an environment that includes the interference frequency harmonics described above (also referred to as frequency comb lines and harmonically derived interference).

Carrier Component Frequency

A system for monitoring the location of underground objects (e.g., boring tool 430) is preferably designed such that it can operate in environments including either of the above-mentioned harmonically derived interference (i.e., interference at approximately 50 Hz intervals or interference at approximately 60 Hz intervals). This is so the same system can be successfully used in different areas of the world. Accordingly, one methodology for attempting to avoid magnetic field interference is to use a carrier component frequency that is purposely offset from both (i.e., avoids) the 50 Hz and 60 Hz harmonic intervals by at least a predetermined frequency offset (e.g., at least 8 Hz). For example, U.S. Pat. No. 5,767,678, entitled "Position and Orientation Locator/Monitor," uses a carrier component frequency of 32768 Hz, which is between the $546^{th}$ and $547^{th}$ harmonics of 60 Hz, and between the $655^{th}$ and $656^{th}$ harmonics of 50 Hz. A limitation of such a system is that any information sidebands of the carrier signal (produced by modulating a carrier reference signal) must be sufficiently narrow to avoid overlapping the 50 Hz or 60 Hz comb lines in order to avoid interference. In other words, the bandwidth of the information sidebands becomes limited, at as a result, the data throughput of such a low bandwidth system is correspondingly limited.

The present invention uses a carrier component frequency that is counter intuitive. Rather than using a carrier component frequency that is offset from 50 Hz and 60 Hz harmonic intervals by at least a predetermined frequency offset to avoid interference (as suggested above), the carrier component frequency is preferably selected such that it is substantially equal to (e.g., ±3 Hz) an integer multiple of both 50 Hz and 60 Hz. More specifically, the selected carrier component frequency is substantially equal to an integer multiple of 300 Hz. This significantly increases the probability that a carrier component of a transmitted magnetic field signal (e.g., signal 104) will be affected by magnetic field interference when power lines are within the vicinity of transmit device 102 and/or receive device 110. Thus, selection of such a carrier component frequency is counter intuitive. Embodiments of the present invention are directed to reducing (and preferably cancelling) such interference near the carrier component frequency, as will be explained in detail below. A benefit of using a carrier component frequency that is substantially equal to a common multiple of both 50 Hz and 60 Hz, is that the width of information sidebands (produced by modulating the carrier component frequency with an encoded information signal) can be increased, thereby increasing data throughput. This is shown in FIG. 9C.

Referring back to FIG. 5, the frequency spectral characteristics of transponder drive signal 532 produced by modulator 530 (and similarly, the frequency spectral characteristics of magnetic field signal 104 transmitted by solenoid 210) is a function of a reference frequency (e.g., generated by reference signal generator 540), modulation scheme, bit rate, and the encoding scheme of encoder 520. More specifically, a carrier component of drive signal 532 (and magnetic field signal 104) has a carrier component frequency that is equal to the frequency of reference signal 542. The modulation scheme creates or provides the information/modulation side band(s). For example, the modulation scheme controls whether the magnetic field signal 104 is a single sideband or a double sideband signal. Amplitude Shift Keying (ASK) and On-Off Keying (OOK) modulations schemes, for example, produce a double sideband signal, as shown in FIGS. 6 and 9C. The bit rate and the encoding scheme control the bandwidth of the sideband(s).

An embodiment of the present invention is directed to an encoding scheme that increases (and preferably maximizes) use of the available information sideband bandwidths, as will be explained in detail below. An embodiment of the present invention is more generally directed to nestling the information sideband(s) between interference comb lines to thereby both increase (and preferably maximize) data throughput and reduce (and preferably minimize) the probability of interference affecting the information sideband(s) (and thus, the data).

The increased bandwidth in which information sidebands can be nestled is a result of transmitting magnetic field signal including a carrier component frequency in close proximity to an interference harmonic, as described above. Accordingly, an embodiment of the present invention is directed to a transmitted magnetic field signal including a carrier component usable for locating an underground object, where the carrier component has a carrier component frequency substantially equal to an integer multiple of 300 Hz. An embodiment of the present invention is also directed to such a magnetic field signal also including one or more information sidebands each including sideband energy, where a substantial portion (e.g., at least 50%) of each sideband energy is contained between the carrier component frequency and a frequency spaced 50 Hz from the carrier component frequency. As mentioned above, the information sideband(s) can be amplitude modulation sidebands. If there are lower and upper information sidebands, as shown in FIGS. 6 and 9C, the lower and upper information sidebands are preferably symmetric about the carrier component. This maximizes the bandwidth of each of the sidebands. It is the information sidebands that convey data from transmit device 102 to receive device 110. More specifically, the sideband(s) may convey data at a bit rate between 50 and 80 bits per second, with 75 bits pers second being convenient because it is a baud rate that is often supported by available microprocessors used in sub-surface tool monitoring system. It is noted that there may be additional sidebands that are further away from the carrier component frequency. These additional sidebands are harmonically related to the sideband(s) that are closest to the carrier component frequency. However, these additional sidebands have much less energy than the sidebands closest to the carrier component frequency.

Figure 10:
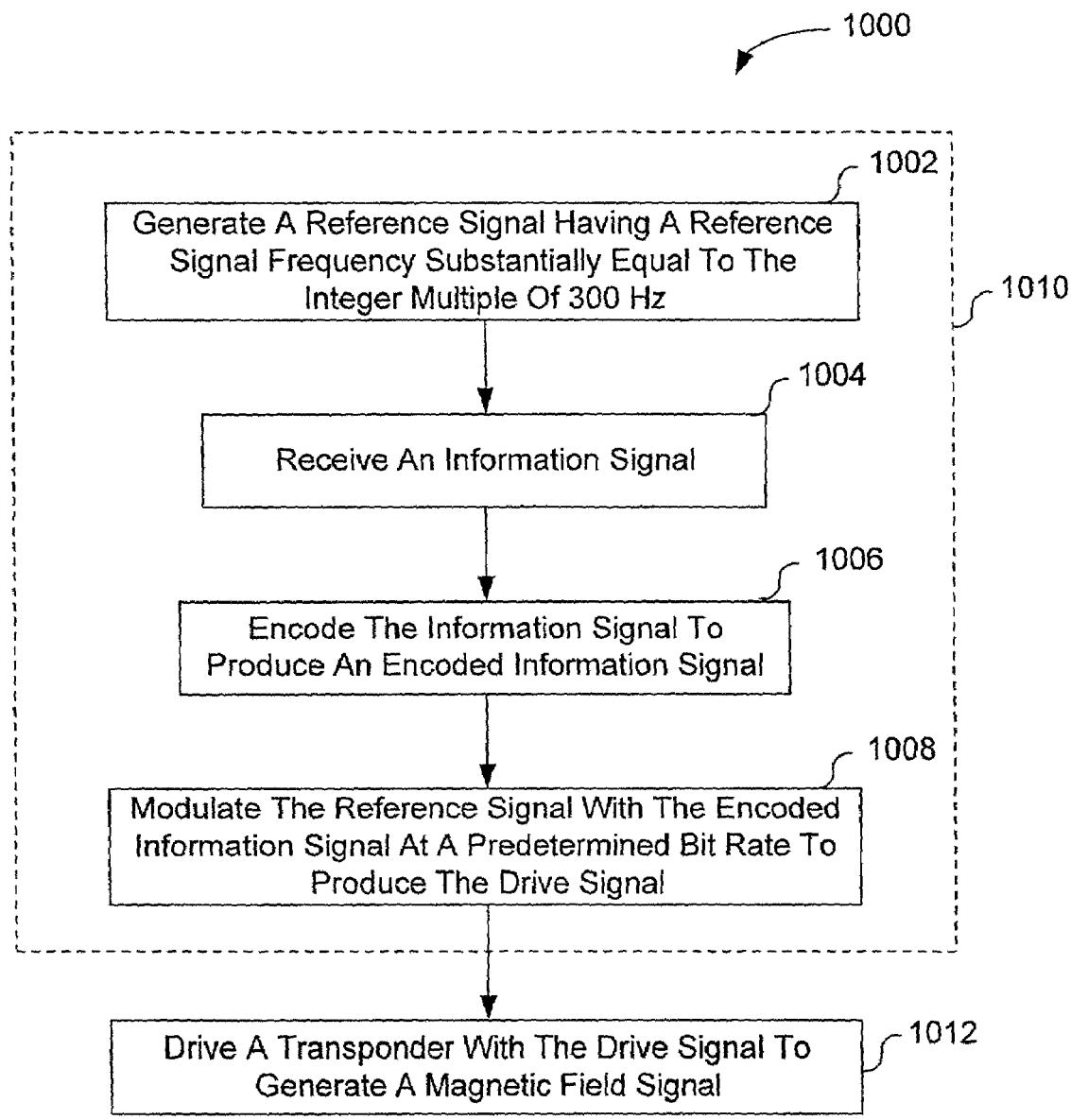
FIG. 10 is flow diagram illustrating a method for generating a magnetic field signal, according to an embodiment of the present invention.

A method 1000 for generating a magnetic field signal usable for locating an underground object, according to an embodiment of the present invention, is described with reference to FIG. 10. In the description of method 1000, reference is made back to FIG. 5 where appropriate.

At a first step 1002, a reference signal having a reference signal frequency substantially equal to the integer multiple of 300 Hz is generated, for example, by reference signal generator 540. At a next step, 1004, an information signal is received, for example, from a system computer 510 or multiplexer. The order of these steps is not meant to be limiting.

At a next step, 1006, the information signal is encoded to produce an encoded information signal, for example, by encoder 520. Next, at a step 1008, the reference signal is modulated with the encoded information signal at a predetermined bit rate (also know as modulation rate) to produce the drive signal. The drive signal includes a carrier component and at least one, and probably two, information sidebands including sideband energy. The encoding of the present invention and choice of bit rate cause a substantial portion of the sideband energy to be contained between the carrier component frequency and a frequency spaced 50 Hz from the carrier component frequency. The encoding of the present invention also causes the carrier component to have a substantially constant average energy. This is important so that the encoding does not affect location determinations that are based on detected magnetic field strength of the carrier component.

Steps 1002 through 1008 can be collectively thought of as a step 1010 of producing a drive signal including a carrier component and at least one frequency sideband, as shown in dashed line. The carrier component has a carrier component frequency substantially equal to an integer multiple of 300 Hz. The carrier component also has a substantially constant average energy due to the encoding scheme of the present invention.

At a next step 1012, a transponder (e.g., solenoid 210) is driven by the drive signal to generate a magnetic field signal. The magnetic field signal has a magnetic field signal carrier component and at least one information sideband. The magnetic field carrier component has a substantially constant average energy and a frequency equal to the reference frequency. The at least one magnetic field signal information sideband includes magnetic field signal sideband energy. A substantial portion of the magnetic field signal sideband energy is contained between the carrier component frequency and a frequency spaced 50 Hz from the carrier component frequency. As described above, the magnitude of the carrier component (when detected) is usable for determining a location of the transponder (and thus any tool in proximity of the transponder). The information sideband(s) convey modulated information.

As mentioned above, according to an embodiment of the present invention a carrier component of magnetic field signal 104 (produced by transmit device 102) has a carrier component frequency that is substantially equal to an integer multiple of 300 Hz, thereby guaranteeing that the carrier component frequency is substantially equal to an integer multiple of both 50 Hz and 60 Hz. This provides a maximum amount of spectral room for information sidebands. However, as mentioned above, using a carrier component frequency that is substantially equal to an integer multiple of 300 Hz will significantly increase the probability that measurements of the carrier component of magnetic field signal 104 will be affected by magnetic field interference when power lines are within the vicinity of transmit device 102 and/or receive device 110. Location determinations are typically based on magnetic field strength measurements of the carrier component of magnetic field signal 104, for example, using the process described above in connection with FIGS. 2A, 2B and 3. Specific embodiments of the present invention are directed to reducing (and preferably cancelling) magnetic field interference when it is present. However, when using a carrier component frequency that is substantially equal to an integer multiple of 300 Hz, it would be beneficial to select a carrier component frequency where interference harmonics tend to be relatively low (as compared to other interference harmonics). Field tests have revealed that even harmonics of 50 Hz and 60 Hz fundamental frequencies generally tend to have less energy content than adjacent, odd harmonics in a given frequency region. Accordingly, in an embodiment of the present invention the carrier component frequency is substantially equal to an even multiple of both 50 Hz and 60 Hz. Two exemplary carrier frequencies that satisfy this requirement are 8400 Hz and 33600 Hz. Specifically, 8400 Hz corresponds to the $140^{th}$ harmonic of 60 Hz, and the $168^{th}$ harmonic of 50 Hz. 33600 Hz corresponds to the $560^{th}$ harmonic of 60 Hz and the $672^{nd}$ harmonic of 50 Hz.

Encoding

As just mentioned, an embodiment of the present invention is directed to nestling the information sideband(s) of a magnetic field signal between interference comb lines. This is accomplished by using an appropriate carrier component frequency, bit rate, modulation scheme, and encoding scheme. The carrier component frequency is preferably selected such that it is substantially equal to an even integer multiple of both 50 Hz and 60 Hz, as stated above. Also, the carrier component of magnetic field signal 104 has a frequency preferably located close to an even harmonic of both 50 Hz and 60 Hz (when power lines are in the vicinity of transmit device 102 and/or receive device 110). Accordingly, 50 Hz and 60 Hz harmonics adjacent to the carrier component are odd harmonics.

In the present invention, information sidebands, as depicted in FIG. 9C, are produced by modulating reference signal 542 with encoded information signal 522 at a given bit/modulation rate. Assume, for example, a bit/modulation rate of 75 bits per second (bps). If each of the encoded bits in the encoded information signal 522 is a complement of its neighboring bits (i.e., 1010101010 . . . ), then the highest frequency modulated signal for that baud rate is produced. This highest frequency modulated signal established the outer bounds of the modulation sidebands. For example, the outer bounds of the sidebands would be approximately 37.5 Hz from the center frequency (i.e., 1÷(2÷75)=37.5), as shown in dashed line FIG. 9C.

Now assume that at the maximum number of consecutive identical bits is two (i.e., 110011001100). This would produce a inner boundary of the sideband that is approximately 18.75 Hz from the center frequency, also shown in dashed line FIG. 9C. In practice, the boundaries of the sideband(s) would not be as sharp as those shown in FIG. 9C. Nevertheless, the information of interest is conveyed by modulation sidebands having energy contained substantially within outer bounds equal to 37.5 Hz and inner bounds equal to 18.75 Hz spaced from the carrier component frequency. Thus, the information of interest is substantially unaffected by the harmonic interference comb lines. Stated another way, the information sidebands are spectrally shaped (by choice of encoding, bit rate, and modulation) such that a substantial portion (e.g., at least 50%) of the sideband energy is contained between the carrier component frequency and a frequency spaced 50 Hz from the carrier component frequency.

As just explained, encoding is one of the factors that affects the spectral shaping of the information sidebands. An embodiment of the present invention is directed to an encoding scheme (including a coding method and apparatus) that can be used to spectrally shape the information sidebands such that they are nestled between a center interference spectral harmonic and its adjacent spectral harmonics. An encoding scheme of the present invention is now described. In an embodiment of the present invention, each four (4) bits of data (e.g., produced by pitch sensor 502, roll sensor 504 and/or temperature sensor 506) are encoded into an eight (8) bit code word. There exist sixteen (16) possible combinations of four bits. There exist two hundred and fifty six (256) possible combinations of eight bits (i.e., there are 256 different code words that can be created from 8 bits). The 16 code words, of the possible 256 code words, are chosen such that:

1) the bits are balanced (i.e., there are an equal number of logic ones and logic zeros);
2) no more than two consecutive bits are identical bits (i.e., there are no more than two ones or two zeros in a row); and
3) each code word is different from any of the other code words by at least two bits.

Limiting the number of consecutive identical bits (to two) has the effect of attenuating low frequency spectral components in modulated (e.g., amplitude modulated) signal 532. The balancing of the bits causes the carrier component of modulated signal 532 to have a substantially constant average energy. These effects are also translated to magnetic field signal 104. The requirement that each code word is different from any of the other code words by at least two bits exists so that a single bit error will not cause one code to be mistaken for another one of the code words.

The encoded data is transmitted synchronously in frames. Each frame includes a header word followed by the encoded bits (i.e., followed by code words). For example, each frame can include an 8 bit header followed by a predetermined number of code words (e.g., 70 code words). Receive device 110 synchronizes itself with the received magnetic field signal using the header words. Accordingly, a header may also be referred to as a synch code, a synch byte, or a frame marker code.

The header is chosen such that:
1) it is different from any of the 16 possible code words by at least two bits; and
2) it is different from any contiguous set of 8 coded bits (e.g., 3 bits of a first code word contiguous with 5 bits of an adjacent code word) by at least one bit;

The above requirements minimize the chances that a signal bit error within the data will cause a decoder (e.g., decoder 714) to mistake a code word for a header, or vice versa.

In order for a header to meet the above requirements, more than two consecutive bits are made to be the same state, and the bits of the header are not be balanced. However, to minimize the deleterious effects of the header on a receiver (e.g. receive device 110), only one group of three bits in a row can exist within a header. Additionally, to compensate for the unbalanced bits in the header, the two headers of successive frames are compliments of one another. This improves packet to packet energy balancing and ensures that the number of logic one bits and logic zero bits is equal over two successive frames, thereby maintaining the substantially average energy of the signal. This also minimizes the risk of false frame synching by a receiver operating in a high noise/interference environment.

A set of code words, according to an embodiment of the present invention, are shown below in Table 1. The 16 possible combinations of 4 bits are shown in the left column. In the right column are shown 16 exemplary 8 bit code words that meet the above mentioned coding requirements (also referred to as conditions). For each row of the Table 1, the 8 bit code word in the right column can be used to represent the corresponding 4 bits in the left column. However, the order (i.e., matching of 4 bits to 8 bit code words) shown in the table is arbitrary. That is, an 8 bit code in the right column can be assigned to represent any one of the 4 bits in the left column, depending on implementation.

TABLE 1

| Possible Combinations of 4 Bits | 8 Bit Codes Words |
| --- | --- |
| 0000 | 10101010 |
| 0001 | 10101001 |
| 0010 | 10100110 |
| 0011 | 10100101 |
| 0100 | 10011010 |
| 0101 | 10011001 |
| 0110 | 10010110 |
| 0111 | 10010101 |
| 1000 | 01101010 |
| 1001 | 01101001 |
| 1010 | 01100110 |
| 1011 | 01100101 |
| 1100 | 01011010 |
| 1101 | 01011001 |
| 1110 | 01010110 |
| 1111 | 01010101 |

An important additional advantage of the codes shown in Table 1 is that a single bit error will not cause one code to be mistaken for another one of the code words. This is because each code word is different from any other code word by least two bits. Accordingly, confidence in received decoded data is thereby increased.

There exist additional 8 bit code words (not shown in Table 1) that meet the above mentioned requirements, i.e., 01001010 and 10110010. Preferably, the 16 codes words (i.e., 8 bit code words) selected to represent the 16 possible 4 bit combinations are selected from the 18 possibilities presented (i.e., from the 16 code words shown in Table 1 and code words 01001010 and 10110010).

Exemplary headers that meet the above specified requirements are 01011101 and 10100010. A one bit error in header 01011101 may produce a code word, for example, code word 01011001. However, this should not present much of a problem since a receiver (e.g., receive device 110) will not be looking for data before has been synchronized. Similarly, a one bit error in code word 01011001 may produce a header, for example, header 01011101. However, this should not present much of a problem after synchronization since the receiver (e.g., receive device 110) knows precisely which frames at which to look for a header. Even prior to synchronization (i.e., during a synchronization process), this should not present a problem.

Assuming a baud rate of 75 bps, use of the above described encoding of the present invention results in a magnetic field signal (e.g., magnetic field signal 104) having information sideband(s) within a recoverable bandwidth of ±37.5 Hz from the carrier component frequency. When the selected carrier component frequency is substantially equal to a common multiple of both 50 Hz and 60 Hz (e.g., the carrier component frequency is 8400 Hz), and thus located close to an interference harmonic (when power lines are in the vicinity of receive device 110), then the information sidebands will be between a center interference spectral harmonic (i.e., close to 8400 Hz in this example) and adjacent interference harmonics. Continuing with this example, the adjacent interference harmonics in the United States would be at approximately 8340 Hz and 8460 Hz, as shown in FIG. 9C. Thus, the encoding scheme of the present invention can be used to spectrally shape the LSB so that it is between 8340 Hz and 8400 Hz, and to spectrally shape the USB so that it is between 8400 Hz and 8460 Hz. In Europe, the adjacent interference harmonics would be at approximately 8350 Hz and 8450 Hz, as shown in FIG. 9C. The same encoding scheme of the present invention would also spectrally shape the LSB so that it is between 8350 Hz and 8400 Hz, and the USB so that it is between 8400 and 8450, also shown in FIG. 9C. Thus, the encoding scheme of the present invention can be used in monitoring devices employed throughout the world.

As just described, embodiments of the present invention are directed to methods for encoding. More specifically, an embodiment of the present invention is directed to a method for producing an encoded information signal having attenuated low frequency spectral components and a substantially constant average energy. Generally, the method includes producing an M bit code word for each N bits of the information signal according to the following conditions: (a) each code word includes an equal number of logic zero bits and logic one bits; (b) each code word includes no more than two consecutive identical bits; and (c) M is greater than N. As described above, in a preferred embodiment M equals eight and N equals four, and the generating of the code words includes producing an eight bit code for each four bits of the information signal. The resulting encoded information signal can be used to produce a magnetic field signal having the desired spectral characteristics discussed above. However, in alternative embodiments of the present invention M and N are not limited to these preferred values (i.e., 8 and 4, respectively), as other values for M and N can be used to produce the desired spectral characteristics. Although not preferred, the condition that no more than two bits are identical can be modified if additional low frequency components can be tolerated (for example, the condition can be that no more than three consecutive bits are identical). One of ordinary skill in the art will appreciate that the number of acceptable consecutive bits can be increase if the bit rate is increased accordingly.

As described above, an embodiment of the present invention also includes generating frames having an equal number of logic zero bits and logic one bits in each pair of consecutive frames. This is accomplished by producing a header for each predetermined number of codes words (e.g., 70 code words) according to the following conditions: (i) each header is different from any of the generated code words by at least two bits; and (ii) each header is a compliment of any immediately preceding header and any immediately following header. As mentioned above, each header is preferably different from any possible contiguous bits of any possible pair of consecutive code words by at least one bit. The headers is preferably the same length as the code words.

Referring back to FIG. 10, the encoding schemes of the present invention can be used at step 1006 to produce a magnetic field signal having the desired frequency spectral characteristics. Embodiments of the present invention are also directed to encoder 520. Encoder 520 includes, for example, code lookup table or memory that stores the plurality of different codes words each representative of a different combination of bits. The encoder may also store at least a first header and a second header, where the second is a complement of the first header. A header insertion means of the encoder inserts one of the first and second headers between each predetermined number of code words to thereby produce frames.

Interference Cancelling

As described above, in an embodiment of the present invention a carrier component of a magnetic field signal (e.g., signal 104 transmitted by transmit device 102) has a carrier component frequency that is substantially equal to an integer multiple of 300 Hz. This guarantees that the carrier component frequency is substantially equal to an integer multiple of both 50 Hz and 60 Hz. This carrier component frequency is selected to provide a maximum amount of spectral room for information sidebands. However, as mentioned above, using a carrier component frequency that is substantially equal to an integer multiple of 300 Hz will significantly increase the probability that magnetic field interference will interference with magnetic field signal strength measurements when power lines are within the vicinity of transmit device 102 and/or receive device 110, unless steps are taken to avoid such interference. As explained above, location determinations can be derived based on magnetic field strength measurements of the carrier component, for example, using the process described above in connection with FIGS. 2A, 2A and 3. As also explained above, magnetic field interference (e.g., produced by power lines) can adversely affect the reliability and accuracy of location determines, and the stability of displays showing the location. The following embodiments of the present invention are directed to reducing (and preferably cancelling) such interference, to thereby improve the reliability and accuracy of location determinations, and the stability of a display of the location (e.g., on display 730).

Prior to explaining these embodiments of the present invention, additional details of how magnetic field interference can affect magnetic field strength measurements of a carrier component are provided. As explained in the discussion of FIGS. 7 and 8, the output signal provided from DSP 708 to system computer 720 is an near DC signal when the magnetic field signal received at antenna array 702 does not include interference. The near DC signal represents the magnitude of the carrier component of the magnetic field signal.

Figure 11:
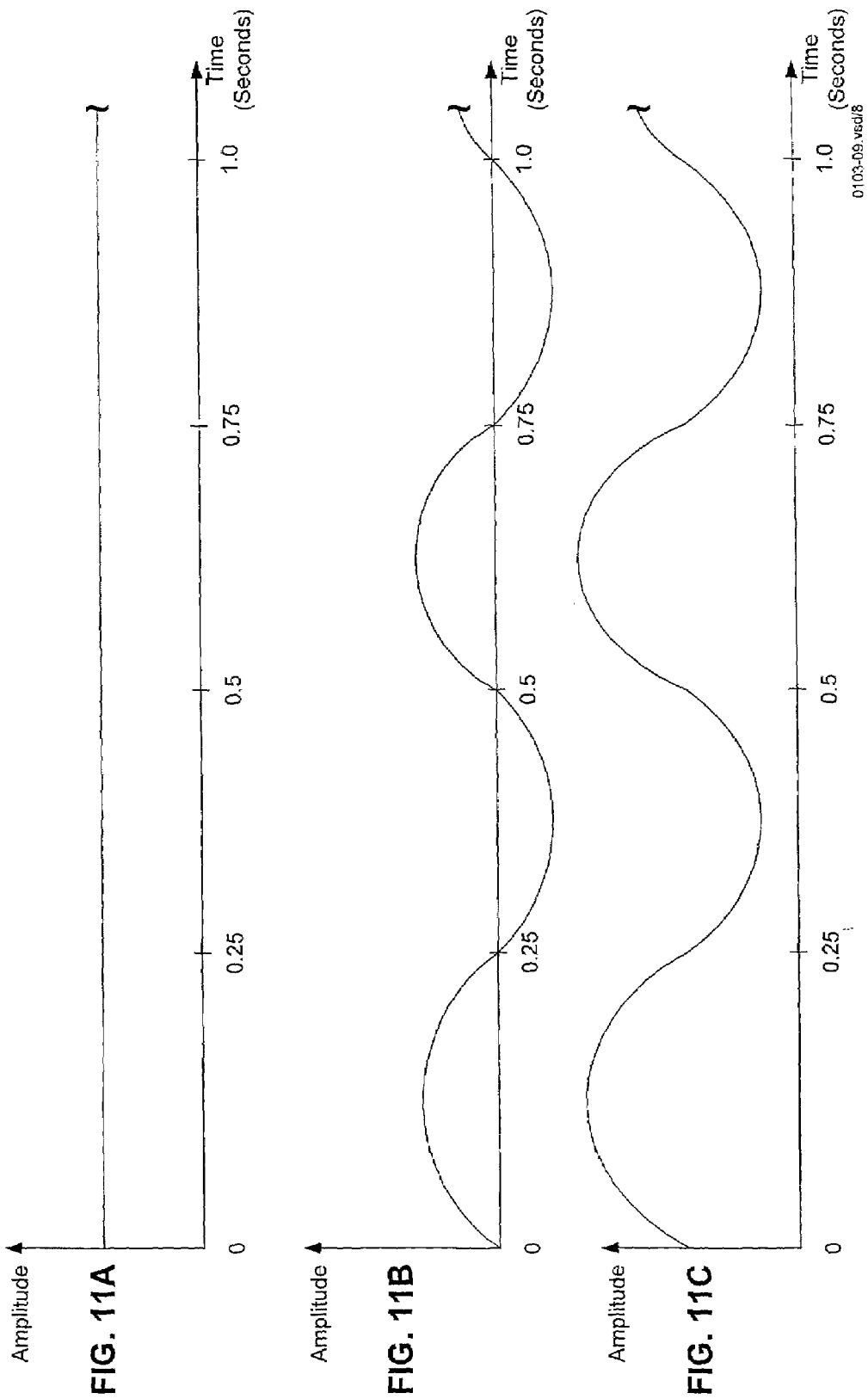
FIG. 11A illustrates an exemplary received magnetic field signal after it is shifted down to a near Direct Current (DC) signal.
FIG. 11B illustrates an exemplary interference harmonic signal after its frequency has been shifted down.
FIG. 11C illustrates an exemplary received magnetic field signal having a beat frequency due to the interference harmonic signal of FIG. 1B.

An exemplary near DC signal is shown in FIG. 11A. System computer 720 determines a location of the underground transmit device 102 based on the magnitude of the near DC signal. However, in the presence of received interference, the signal provided from DSP 708 (to system computer 720) tends to be amplitude modulated by the interference such that a beat frequency results from the interference. This will adversely affect the reliability, accuracy, and stability of location determinations.

As mentioned above, power lines of power distribution networks produce harmonica interference signals at regular 50 Hz or 60 Hz intervals from their fundamental frequency through to well above 10 kHz. More precisely, the harmonic intervals are 50 Hz±0.1 Hz or 60 Hz±0.1 Hz. For example, if harmonic intervals caused by power lines in an area (e.g., within the United States) are at 60.0035 Hz intervals, then the 140$^{th}$ harmonic is at approximately 8400.5 Hz. The beat frequency of a received signal including both an 8400 Hz carrier component frequency and an 8400.5 Hz interference signal, after being shifted down (i.e., mixed down) by 8400 Hz, is shown in FIG. 11C. More specifically, FIG. 1A is a time domain illustration of an 8400 Hz carrier component frequency shifted down to near DC. FIG. 11B is a time domain illustration of a 8400.5 Hz interference signal shifted down by 8400 Hz to a signal having a frequency of approximately 0.5 Hz. FIG. 1C is a time domain illustration of a combined signal (including the 8400 Hz carrier and the 8400.5 Hz interferer) after being shifted down by 8400 Hz. The combined signal of FIG. 11C (e.g., the signal received by receive device 110) is shown as having a beat frequency of 0.5 Hz. In other words, after down conversion, the combined signal has a cycle period of one second.

It is noted, if a magnetic interference frequency is offset from the carrier component frequency such that it falls outside of an operating bandwidth of signal strength measurement system (e.g., if offset from the carrier component frequency by more than 0.5 Hz, assuming an exemplary operating bandwidth of 0.5 Hz), after being shifted down to baseband, then the filters of digital signal processor 708 should filter out the magnetic interference. Accordingly, magnetic interference outside the operating bandwidth of the system should not adversely affect the magnetic field strength measurements at antenna array 702 of receive device 110. However, if the magnetic field interference is within, for example, 0.5 Hz of the carrier signal at baseband, then location determinations (of solenoid 210, and thus boring tool 430) can be adversely affected because the magnitude of the carrier signal is altered by magnetic interference, as shown in FIG. 11C. The reason this occurs is that the magnetic interference falls within the bandwidth of the magnetic field strength measurement processing. Accordingly, there is a need to reduce (and preferably cancel) magnetic field interference that is within such a close proximity (e.g., within 0.5 Hz) of the carrier component frequency.

The specific embodiments of the present invention that are directed to reducing (and preferably cancelling) the magnetic field interference that is within such a close proximity to the carrier component frequency (i.e., within the operating bandwidth of the field strength measuring system) shall now be described. These embodiments are explained with reference to the flowchart of FIG. 12, which outlines a method 1200 for reducing magnetic interference.

At a first step 1202, a plurality of samples that are representative of a detected carrier component magnetic field strength are produced. This step can be performed, for example, by A/D 706 and DSP 708. For example, these samples can be samples of the signal of FIG. 11C, which has just been discussed above.

Figure 12:
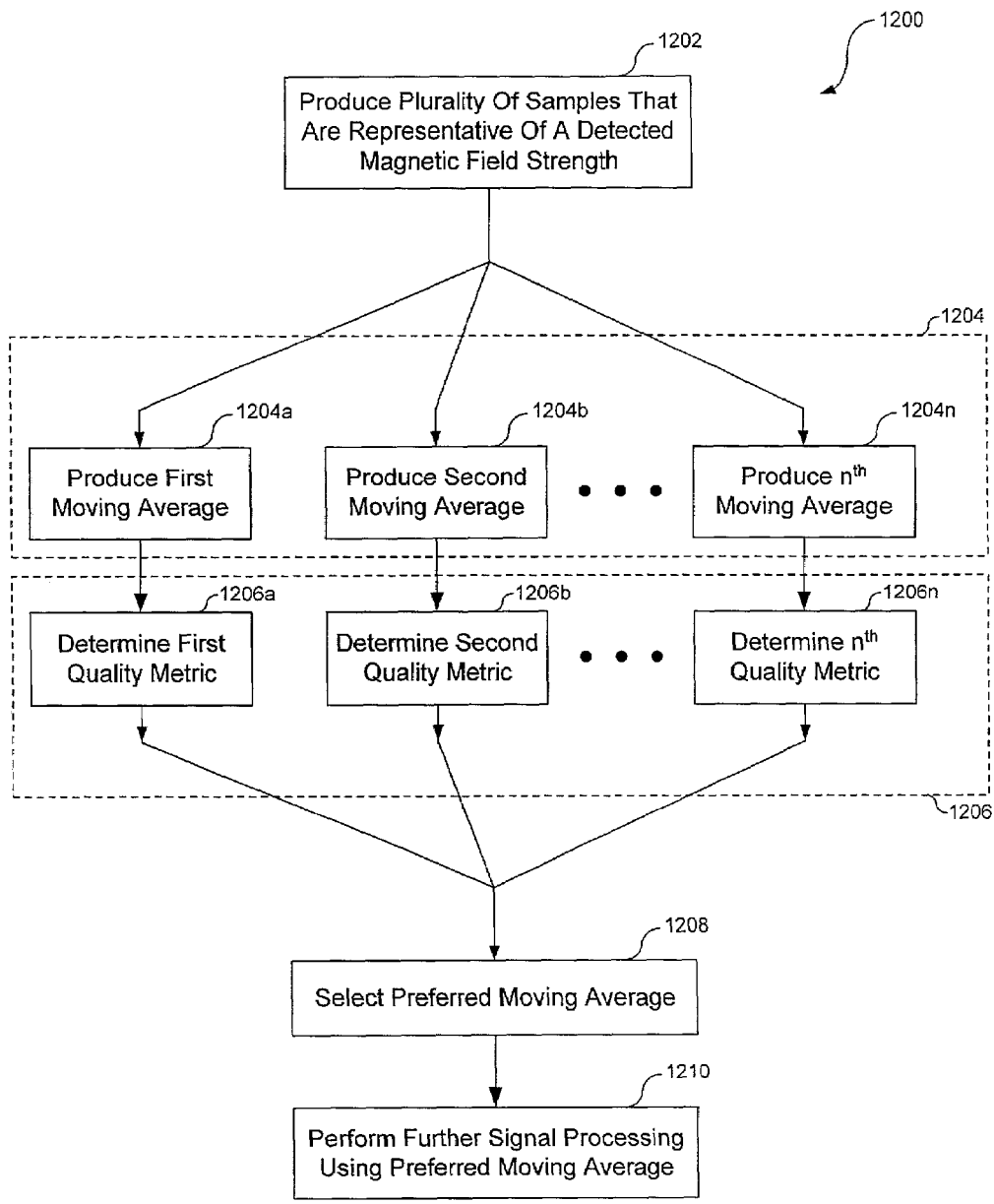
FIG. 12 is a flow diagram illustrating a method for reducing interference according to an embodiment of the present invention.

At a next step 1204, a plurality of n different moving averages of the plurality of samples are produced, where n is at least two. Each moving average is produced by averaging successive sets of the samples, to thereby produce successive average values corresponding to the successive sets of samples from step 1202. Thus, each moving average includes a plurality of average values. Each of the different moving averages is a moving average of a different number of the plurality of samples (i.e., the set size associated with a first moving average is different from a set size associated with a second moving average). More specifically, each of the different moving averages has a different moving average length. Each moving average length corresponds to a time-span over which the samples within the respective moving average extend. The different moving averages can be produced in parallel, as shown in FIG. 12. For example: at a step 1204a, a 1$^{st}$ moving average is produced; at a step

1204b a $2^{nd}$ moving average is produced; . . . and at a step 1204n, an $n^{th}$ moving average is produced. In another embodiment, rather than producing the moving averages in parallel, the moving averages are produced serially.

At a next step 1206, a respective quality metric is determined for each moving average produced at step 1204. For example, at a step 1206a, a $1^{st}$ quality metric is produced for the moving average produced at step 1204a; at a step 1206b a $2^{nd}$ quality metric is produced; . . . and at a step 1204n, an $n^{th}$ quality metric is produced. Each quality metric can be an amplitude variance ($\sigma^2$) of the corresponding moving average. A well known equation for variance is:

$$\sigma^2 = \frac{\sum_{i=1}^{N}(x_i - \mu)^2}{N}$$

In this example,
$\sigma^2$ represents the amplitude variance of a moving average,
$x_1$ represents the amplitude of one average value in the moving average,
N represents the number of average values in the moving average, and
$\mu$ represent the mean (i.e., average) amplitude of the average values in the moving average.

The above equation determines biased amplitude variance. Other types of amplitude variance that can be used include unbiased amplitude variance (where the denominator is N-1) and absolute variance. Those of skill in the art will appreciate that additional measures of variance can also be used, or measures of standard deviation can be used.

In another embodiment, each quality metric can be a difference between the minimum average value and maximum average value of a respective moving average. This can be accomplished by determining a respective maximum and minimum of each of the moving averages. A difference between the maximum and minimum of each of the moving averages is then determined. In still another embodiment, each quality metric can be the ratio of the minimum to maximum of a respective moving average.

At a next step 1208, a preferred moving average (that is, a preferred one of the plurality of moving averages produced at step 1204) is selected based on the quality metrics determined at step 1206. For example, if the quality metrics determined at step 1206 are variances, then the moving average corresponding to the lowest variance is selected at step 1208. If the quality metrics determined at step 1206 are the differences between maximums and minimums of each moving average, then the moving average corresponding to the lowest difference is selected at step 1208. Similarly, if the quality metrics determined at step 1206 are ratios of the minimums and maximums of each moving average, then the moving average corresponding to the lowest ratio is selected at step 1208.

At a next step 1210, further signal processing is performed using the preferred moving average. For example, the preferred moving average can be used to monitor the location of an underground boring tool.

As mentioned above, each of the moving averages corresponds to a respective moving average length that is representative of the time interval during which the samples within the moving average were produced. Each moving average length is different from the other moving average length(s). In an embodiment of the present invention, additional moving averages of additional samples of the magnetic field signal are produced, and used for further signal processing (e.g., used to monitor the location of an underground boring tool). These additional moving averages have a moving average length equal to the length of the moving average selected at step 1208 (i.e., a preferred moving average length). This can occur following step 1210. Alternatively, this can occur in place of step 1210. The additional moving averages having the preferred moving average length are then used for further signal processing (e.g., to determine a location of an underground boring tool).

The different moving average lengths should be within (i.e., correspond to) a range of expected interference cycle periods that may adversely affect the carrier component of transmitted magnetic field signal 104 because the interference cycle periods fall within the operating bandwidth of the measurement system. More specifically, the different moving average lengths should collectively span the range of expected interference cycle periods that can affect measurements of the carrier component. Another way to look at this is that the moving average lengths should collectively span an operating bandwidth of the signal measurement system.

As mentioned above, an interfering harmonic that is offset from the frequency of the carrier component by more than 0.5 Hz should be filtered out by filters of stages 704 and/or 802 because it is within the operating bandwidth of the system. In such a system, only those interfering harmonics within, for example, 0.5 Hz of the carrier component frequency of magnetic field signal 104 will adversely affect carrier component measurements. Therefore, in the example system having a 0.5 Hz operating bandwidth, the different moving average lengths should collectively span a range in time corresponding to a range in interference frequencies beginning at a frequency near 0 Hz and ending at the frequency of 0.5 Hz.

For example, it can be appreciated that a moving average length of 0.5 seconds or 1 second applied to the cyclically repeating corrupted signal of FIG. 11C, will result in a moving average including average values substantially equal to the magnitude of the desired signal in FIG. 11A. Thus, an appropriately chosen moving average length reduces the effects of an interfering harmonic (in this example, substantially cancels the effects of the interfering harmonic). Accordingly, the moving average selected at step 1208 can be thought of as a filtered signal.

In a preferred embodiment, the moving average lengths span between one-times and less than two-times the cycle length of expected interference. Thus, for the example of FIG. 11C, the moving average lengths span between 2 seconds and 4 seconds (e.g., 2 seconds, 2.5 seconds, 3.0 second and 3.5 seconds, respectively corresponding to interference frequencies of 0.5 Hz, 0.4 Hz, 0.33 Hz and 0.26 Hz). However, the longest moving average length should be shorter than twice the shortest moving average length. This is because the longer moving average length, of two moving average lengths that are both integer multiples of a cycle length of an interferer, will always be more stable and thus selected as the preferred moving average. This increases the latency of the system without significantly improving performance. It is noted that operating bandwidths a system can have operating bandwidths other than 0.5 Hz, and thus, these embodiments of the present invention are not limited to this operating bandwidth.

The samples from which the moving averages are derived can be produced with a constant sample spacing (that is, time between samples). If this is the case, each moving average length is defined by a product of the number of samples in the respective moving average and the sample spacing.

Figure 13:
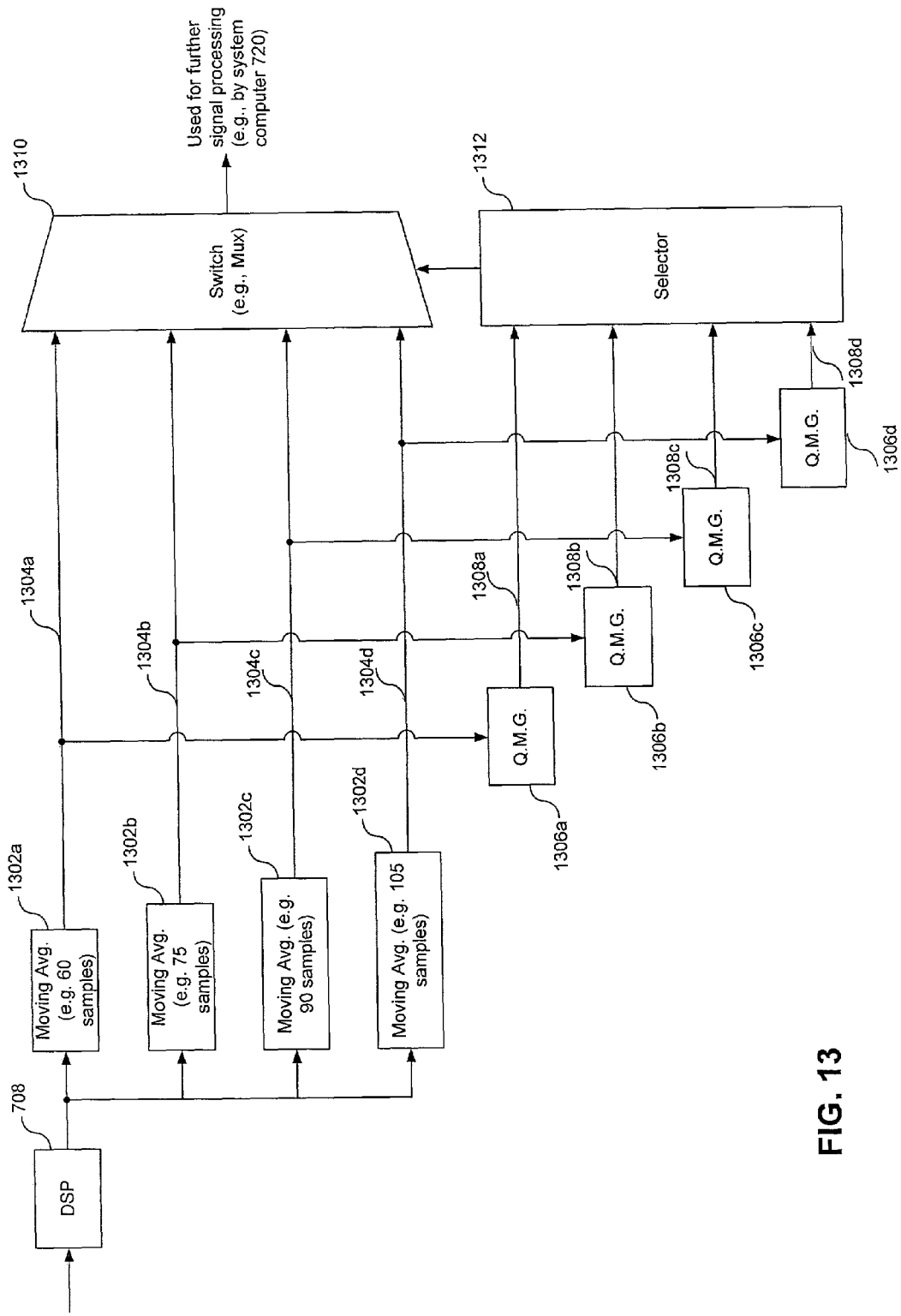
FIG. 13 is a functional block diagram of a system for reducing interference according to an embodiment of the present invention.

FIG. 13 is a function block diagram that can also be used to described the interference cancelling of the present invention. As shown, first moving averager 1302a, second moving averager 1302b, third moving averager 1302c and fourth moving averager 1302d each receive (e.g., from DSP 708) samples (for example, magnitude samples) that are representative of magnetic field strength. Each moving averager outputs a respective moving average signal 1304a, 1304b, 1304c and 1304d, each moving average signal including a plurality of average values. Quality metric generators (Q.M.G.s) 1306a, 1306b, 1306c and 1306d produce respective quality metric outputs 1308a, 1308b, 1308c and 1308d that can be measures of variance, difference between maximum and minimums, or ratios between maximums and minimums, as discussed above. A selector 1312 selects a preferred moving average based on the quality metric outputs 1308a, 1308b, 1308c and 1308d. Selector 1312 then directs a switch 1310 to pass forward a preferred one of moving average signals 1304a, 1304b, 1304c and 1304d to be used for further signal processing (e.g., to be used by system computer 720 to produce location determinations). The boundaries of the functional building blocks shown in FIG. 13 have been arbitrarily defined for the convenience of the description. Alternate boundaries can be defined so long as the specified functions and relationships thereof are appropriately performed. For example, various function can be combined into one block (e.g., selector 1312 and switch 1310 can be combined).

Assume the samples received by moving averagers 1302a, 1302b, 1302c and 1302d have a rate of 30 samples per second. If moving averager 1302a produces a moving average of 60 samples, then its moving average length is 2 seconds. Similarly, if moving averager 1302b produces a moving average of 75 samples, then its moving average length is 2.5 seconds. Similarly, if moving averager 1302c produces a moving average of 90 samples, then its moving average length is 3.0 seconds. Similarly, if moving averager 1302d produces a moving average of 105 samples, then its moving average length is 3.5 seconds.

Referring to FIG. 7, the interference cancelling embodiments of the present invention can be performed between DSP 708 and system computer 720. Alternatively, these embodiments can be performed within DSP 708 and/or system computer 720. The features of these embodiments can be performed by hardware, entirely within software, or by a combination of hardware and software.

Data/Information Recovery

Figure 14:
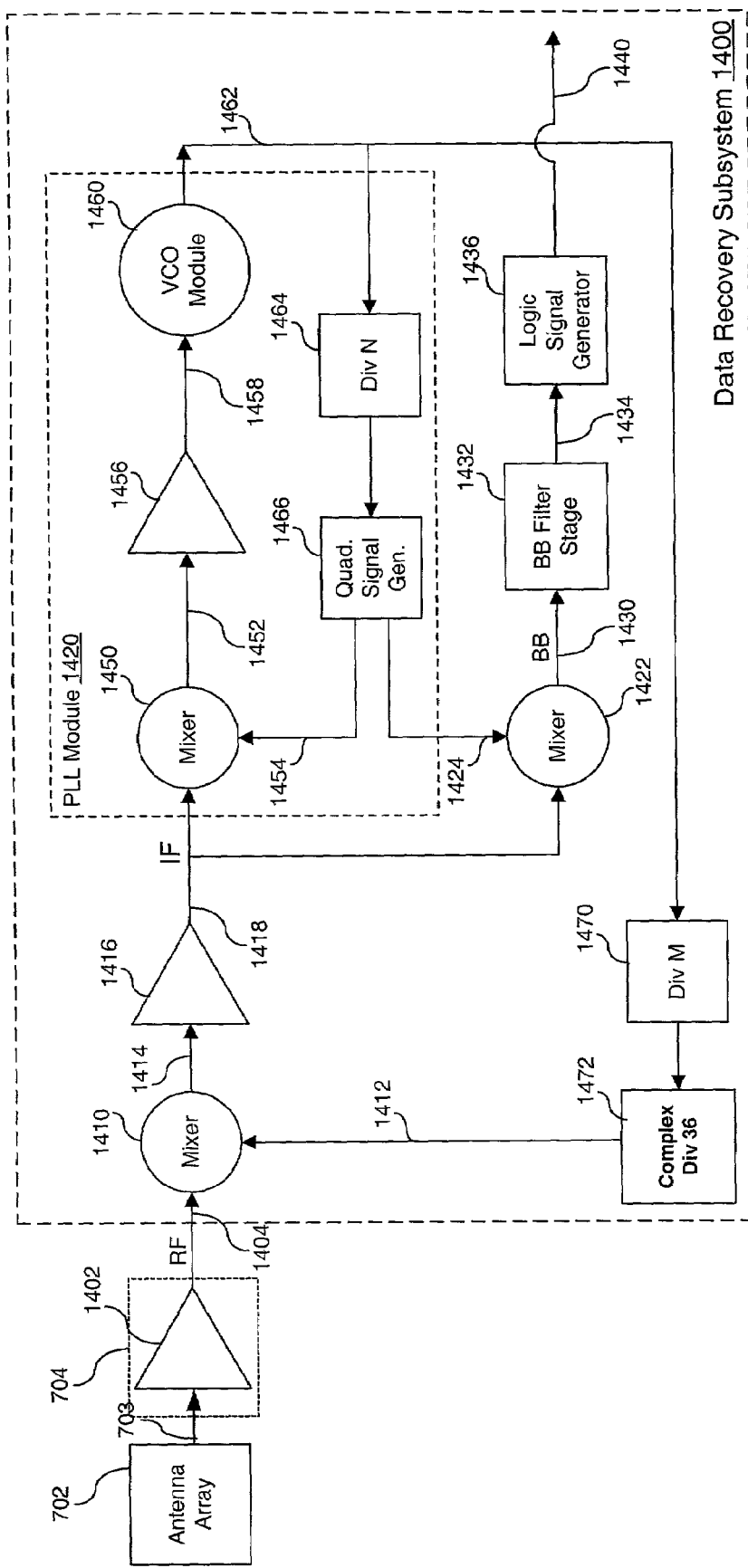
FIG. 14 is a block diagram of an example data recovery subsystem.

FIG. 14 is a block diagram of an example data recovery subsystem 1400 (representing data recovery subsystem 712 of FIG. 7), depicted in relation to antenna 702 and an exemplary relevant portion of frequency down-converter, amplifier and filter 704 (also referred to as "circuit 704" for convenience). Antenna array 702 provides RF signal 703 representative of the received magnetic field signal to circuit 704. RF signal 703 includes an RF carrier component and at least one RF modulation sideband, as depicted, for example, in FIGS. 6 and 9C, described above. RF signal 703 may also include RF interference as depicted in FIG. 9C. In an exemplary arrangement of the present invention, the RF carrier component of RF signal 703 has a frequency equal to an integer multiple of both 50 and 60 Hz, such as 8400 Hz. Also, the RF signal includes the LSB and USB information/modulation sidebands with frequency characteristics (such as frequency bandwidths) as depicted in FIG. 9C. In the exemplary arrangement of the present invention, the LSB and USB modulation sidebands are amplitude modulation sidebands.

A signal conditioner 1402 of circuit 704 amplifies and bandpass filters RF signal 703, to produce a conditioned RF signal 1404 also representative of the magnetic field signal received at antenna 702. Signal conditioner 1402 provides conditioned RF signal 1404 to a first mixer 1410 of data recovery subsystem 1400. Mixer 1410 frequency-mixes conditioned RF signal 1404 with a first LO signal 1412 to produce an IF signal 1414, also representative of the magnetic field signal. IF signal 1414 includes an IF carrier component and at least one information/modulation sideband, as depicted, for example, in FIGS. 6 and 9C, except the IF carrier component is at an IF frequency, not an RF frequency. In the exemplary arrangement mentioned above, the IF carrier component of the IF signal has an IF frequency approximately equal to 768 Hz.

First mixer 1410 provides IF signal 1414 to an IF signal conditioner 1416 configured to bandpass filter and amplify IF signal 1414. Signal conditioner 1416 provides a conditioned IF signal 1418 to both a PLL module 1420 and a second mixer 1422. Conditioned IF signal 1418 has spectral characteristics similar to those of IF signal 1414, and is thus representative of the magnetic field signal. PLL module 1420 synchronizes (for example, phase-locks) an output signal 1424 (also referred to as a second LO signal 1424) of the PLL module to the IF carrier component of IF signal 1418.

PLL module 1420 provides second LO signal 1424 to second mixer 1422. Second mixer 1422 frequency-mixes IF signal 1418 with second LO signal 1424 to produce a baseband signal 1430. Since second LO signal 1424 is synchronized (for example, phase-locked) to the IF carrier component of signal 1418, second mixer 1422 synchronously mixes IF signal 1418 with LO signal 1424 to produce a demodulated sideband corresponding to the modulation sideband(s) of IF signal 1418. In this manner, second mixer 1422 synchronously detects and recovers the modulation sideband(s) included in the magnetic field signal received by antenna 702. In the exemplary arrangement, mixer 1422 synchronously detects and recovers the amplitude modulation sidebands.

Second mixer 1422 provides baseband signal 1430, including the synchronously detected and recovered information sideband(s), to a baseband filter stage 1432. Filter stage 1432 filters baseband signal 1430 to produce a filtered baseband signal 1434. Filter stage 1432 has a bandpass filter characteristic. Filter 1432 has a passband bandwidth coinciding with a bandwidth of the demodulated sideband included in baseband signal 1430. In the exemplary arrangement, filter 1432 has lower and upper stopband regions for substantially attenuating frequencies at zero and 50 Hz, respectively.

Baseband filter stage 1432 provides filtered baseband signal 1434 to a logic signal generator 1436. In the exemplary arrangement, baseband signal 1430 is an analog signal. Logic signal generator 1436 derives a logic signal (not shown in FIG. 14) from filtered baseband signal 1434. The logic signal represents information (for example, logic ones ("1s") and logic zeros ("0s")) conveyed by the demodulated sideband included in filtered baseband signal 1434. However, the logic signal tends to include undesirable timing jitter. Thus, logic signal generator 1436 advantageously synchronizes the logic signal to a stable, local re-synchronizing clock, thereby producing a re-synchronized logic signal 1440, having reduced timing jitter. This process can also be referred to as "re-timing" and "dejittering" the originally derived/recovered logic signal using the local re-synchronizing clock (also referred to as a "re-timing" or "de-jittering" clock). Logic signal generator 1436 provides re-synchronized logic signal 1440 to next-stage processing, such as decoder 714, mentioned above in connection with FIG. 7.

PLL module 1420 includes a PLL mixer/phase detector 1450 to derive an error signal 1452 representative of a phase difference between the IF carrier component of IF signal 1418 and a PLL feedback/LO signal 1454. Mixer/phase detector 1450 provides error signal 1452 to a filter stage 1456 for filtering the error signal. Filter stage 1456 provides a filtered error signal 1458 to a VCO module 1460. VCO module 1460 generates a VCO output signal 1462 having a phase and frequency responsive to filtered error signal 1458. VCO output signal 1462 is synchronized (for example, phase-locked) to the IF carrier component of IF signal 1418.

VCO module 1460 provides VCO output signal 1462 to a PLL feedback circuit, including a divider 1464 followed by a quadrature signal generator 1466. Divider 1464 divides the frequency of VCO output signal 1462 by a programmable number (N). Divider 1464 provides a divided-down version of VCO output signal 1462 to quadrature signal generator 1466. Quadrature signal generator 1466 generates PLL feedback/LO signal 1454 and second LO signal 1424 in quadrature to one another (for example, signal 1454 leads signal 1424 in phase by 90°), in response to the divided-down signal from divider 1464.

VCO module 1460 also provides VCO output signal 1462 to a second feedback stage, including a first divider 1470 followed by a second divider 1472. The second feedback stage derives feedback signal 1412 (that is, first LO signal 1412) from VCO output signal 1462, whereby first LO signal 1412 is also phase-locked to the IF carrier component of IF signal 1418. Synchronizing (for example, phase-locking) both first LO signal 1412 and second LO signal 1424 in this manner yields performance advantages in the present invention, such as narrowband operation having noise reducing characteristics.

In the present invention, mixer 1410, IF signal conditioner 1416, PLL module 1420, and dividers 1470, 1472 form an outer-loop for synchronizing (for example, phase-locking) first LO signal 1412 to the carrier components of RF signal 1404 and IF signal 1418. Also, mixer 1450, filter 1456, VCO module 1460, divider 1464, and quadrature signal generator 1466 form an inner-loop for synchronizing (for example, phase-locking) feedback signal 1454 and second LO signal 1424 to the IF carrier component of IF signal 1418. VCO output signal 1462 is used as a synchronizing feedback signal in both of the just-mentioned inner- and outer-loops. The term "synchronizing" as used herein is not meant to be limited to phase-locking. For example, synchronizing can also mean frequency-locking, or otherwise synchronizing the first and second LO signals to the RF and IF carrier components mentioned above.

Figure 15:
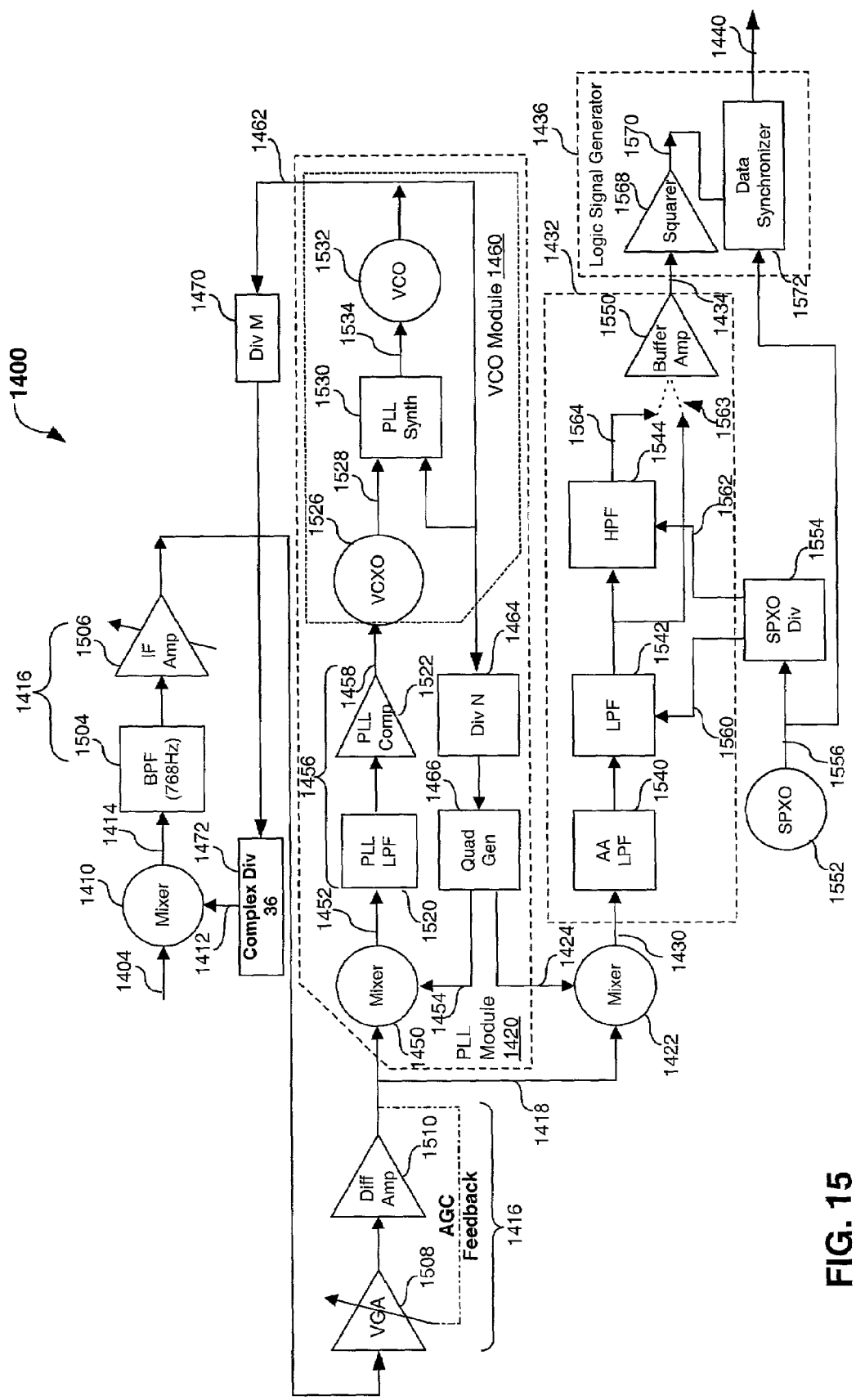
FIG. 15 is a block diagram expanding on the data recovery subsystem of FIG. 14, in accordance with an embodiment of the present invention.

FIG. 15 is a block diagram expanding on data recovery subsystem 1400, in accordance with an embodiment of the present invention. First mixer 1410 provides IF signal 1414 to IF signal conditioner 1416. Signal conditioner 1416 includes, connected in series, an IF bandpass filter 1504 (centered at 768 Hz, for example), an IF amplifier 1506, a variable gain amplifier 1508, and a differential amplifier 1510.

PLL module 1420 includes filter stage 1456 connected between mixer/phase detector 1450 and VCO module 1460. Filter stage 1456 includes a Low Pass Filter (LPF) 1520 followed by a compensator 1522. LPF 1520 can be, for example, a third order Sallen & Key section, with a selectable cut-off frequency. The purpose of LPF 1520 is to attenuate undesired alternating current (AC) signal "noise" included in signal 1452. LPF 1520 helps prevent such AC noise from ultimately frequency modulating VCO output signal 1462. Compensator 1522 is an integrator used to achieve a stable second order PLL characteristic.

VCO module 1460 includes a voltage controlled crystal oscillator (VCXO) 1526. VCXO 1526 is the primary frequency variable element of PLL module 1420. VCXO 1526 has a very low value transfer function (that is, change in VCXO output frequency with change in input control voltage. The input control voltage for VCXO corresponds to signal 1458 from filter stage 1456. This transfer function is a dominant factor in obtaining low bandwidth and high noise rejection characteristics of PLL module 1420, in order to obtain optimum data recovery performance in data recovery subsystem 1400.

VCXO 1526 provides a reference signal 1528 to a frequency-scaling PLL, including a PLL synthesizer 1530 and a VCO 1532, within the inner-loop mentioned above in connection with FIG. 14. PLL synthesizer 1530 and VCO 1532 together scale the frequency of reference signal 1528 (generated by VCXO 1526) as appropriate for the correct operation of PLL module 1420, and data recovery subsystem 1400. VCO 1532 generates VCO output signal 1462 used to synchronize (for example, phase-lock) both first and second LO signals 1412 and 1424 to the IF carrier component of IF signal 1418 in response to filtered error signal 1458, as discussed above. PLL synthesizer 1530 generates a control signal 1534 in response to a phase difference between reference signal 1528 and VCO output signal 1462. VCO 1532 generates VCO output signal 1462 in response to control signal 1534.

Second mixer 1422 provides baseband signal 1430 to filter stage 1432. Filter stage 1432 includes, connected in series, an anti-aliasing LPF 1540, a LPF 1542 (which may be a switched-capacitor filter, for example), a High Pass Filter (HPF) 1544 (which may also be a switched-capacitor filter), and a buffer amplifier 1550. A local clock circuit, including an oscillator 1552 followed by a divider 1554, generates a plurality of local clocks used by filter stage 1432 and logic signal generator 1436. Oscillator 1552 (which may be a crystal oscillator SPXO) generates a first clock 1556, and provides the first clock to both divider 1554 and logic signal generator 1436. Divider 1554 generates both a second clock 1560 and a third clock 1562 from first clock 1556. LPF 1542 and HPF 1544 respectively operate in accordance with second and third clocks 1560 and 1562, in the exemplary switched filter arrangement depicted in FIG. 15.

Anti-aliasing filter 1540 provides sufficient high frequency attenuation to prevent switched-capacitor LPF 1542 from aliasing. In one embodiment, anti-aliasing LPF 1540 is a third-order SALLEN & KEY filter. LPF 1542 and HPF 1544 together form a bandpass filter, mentioned above in connection with FIG. 14. LPF 1542 is the primary filter for removing noise from baseband signal 1430. In one embodiment, filter 1542 is a tenth-order, linear phase, data sampling low-pass filter device. Such a filter provides a "better-than-Bessel" linear phase response ensuring that the signal output by the filter has an analog data eye-pattern that is not degraded by the filter phase response. In the exemplary arrangement of data recovery subsystem 1400 mentioned above, LPF 1542 has a 3 dB cut-off frequency of 37.5 Hz, and gives attenuation figures of approx. 24 dB with interference at 50 Hz, and greater than 45 dB with interference at 60 Hz.

In the exemplary arrangement of the present invention, the recovered sideband included in baseband signal 1430 has a low-frequency band edge at a frequency approximately equal to 18.75 Hz. In another exemplary arrangement, the recovered sideband has a low-frequency band edge at a frequency approximately equal to 12.75 Hz. HPF 1544 attenuates low frequency interference below a frequency of approximately 13.75 Hz,. that is, near the band edge of the recovered sideband. Such interference can occur when there is interference at, or close to, the RF carrier component of RF signal 1404. HPF 1544 provides a filtered baseband signal 1564 to buffer amplifier 1550. Buffer amplifier 1550 provides filtered, baseband signal 1434 to logic signal generator 1436. Buffer amplifier 1550 also provides a mechanism for bypassing HPF 1544 via an input switch 1563, connected between the amplifier, HPF 1544 and LPF 1542.

Logic signal generator 1436 includes a squarer circuit 1568 to derive a logic signal 1570 (discussed above in connection with FIG. 14) from baseband signal 1434. Squarer circuit 1568 includes a comparator to derive either a logic high signal or a logic low signal from baseband signal 1434. Logic signal 1570 has a "squared" appearance in the time domain, compared to baseband signal 1434. Squarer 1568 provides logic signal 1570 to a synchronizer 1572. Synchronizer 1572 synchronizes logic signal 1570 to a re-synchronizing clock (not shown) derived from first clock 1556, thereby producing re-synchronized logic signal 1440.

Figure 16:
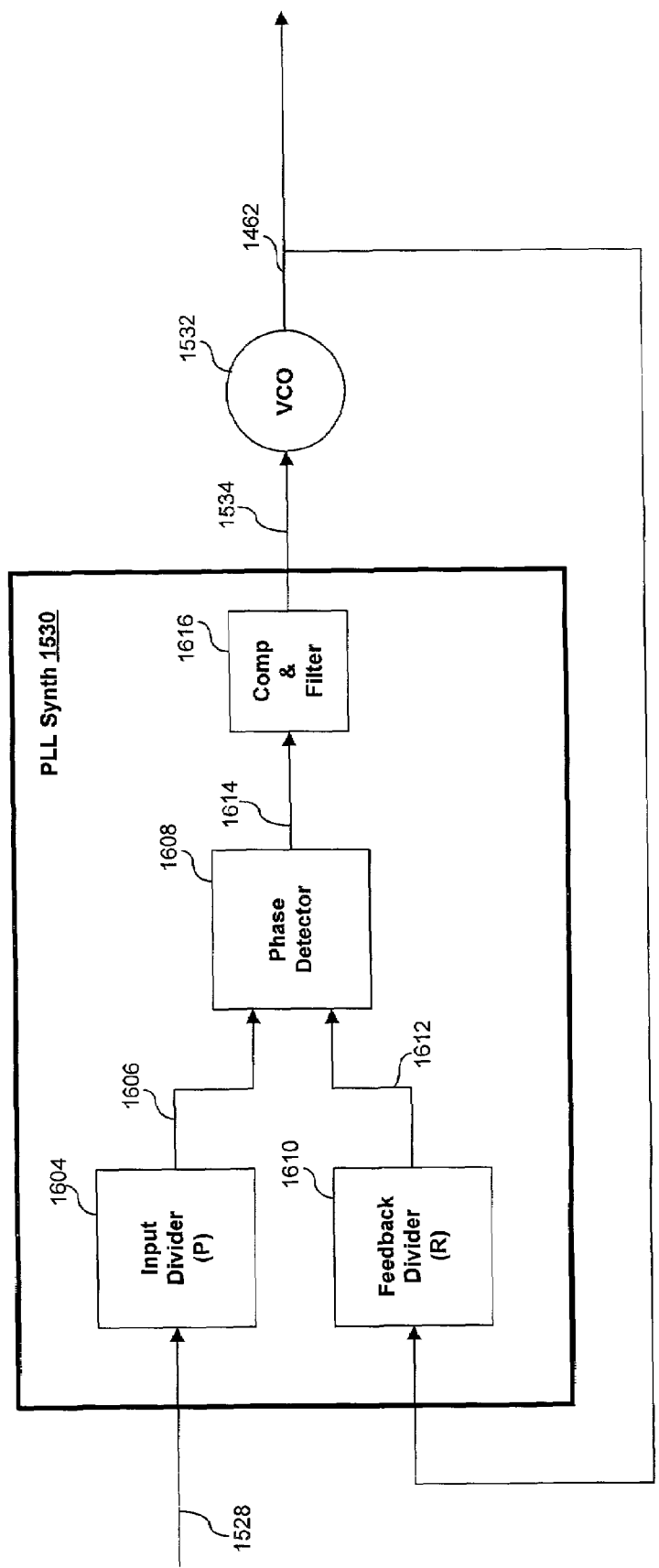
FIG. 16 is a block diagram expanding on an inner phase locked loop of FIG. 15, according to an embodiment of the present invention.

FIG. 16 is a block diagram of the frequency scaling PLL mentioned above in connection with FIG. 15, according to an embodiment of the present invention. The inner frequency scaling PLL includes PLL synthesizer 1530 and VCO 1532. PLL synthesizer 1530 includes a first divider 1604. Divider 1604 receives reference signal 1528 from VCXO 1526, and provides a divided-down version 1606 of reference signal 1528 to a first input of a phase detector 1608. A feedback divider 1610 divides-down the frequency of VCO output signal 1462, to provide a divided-down version thereof 1612 to a second input of phase detector 1608. Phase detector 1608 derives an error signal 1614 indicative of a phase difference between signals 1606 and 1612. Phase detector 1608 provides error signal 1614 to a compensator and filter 1616. Compensator and filter 1616 provides filtered error signal 1534 as a control signal to VCO 1532. VCO 1532 generates VCO output signal 1462 in response to signal 1534.

Figure 17:
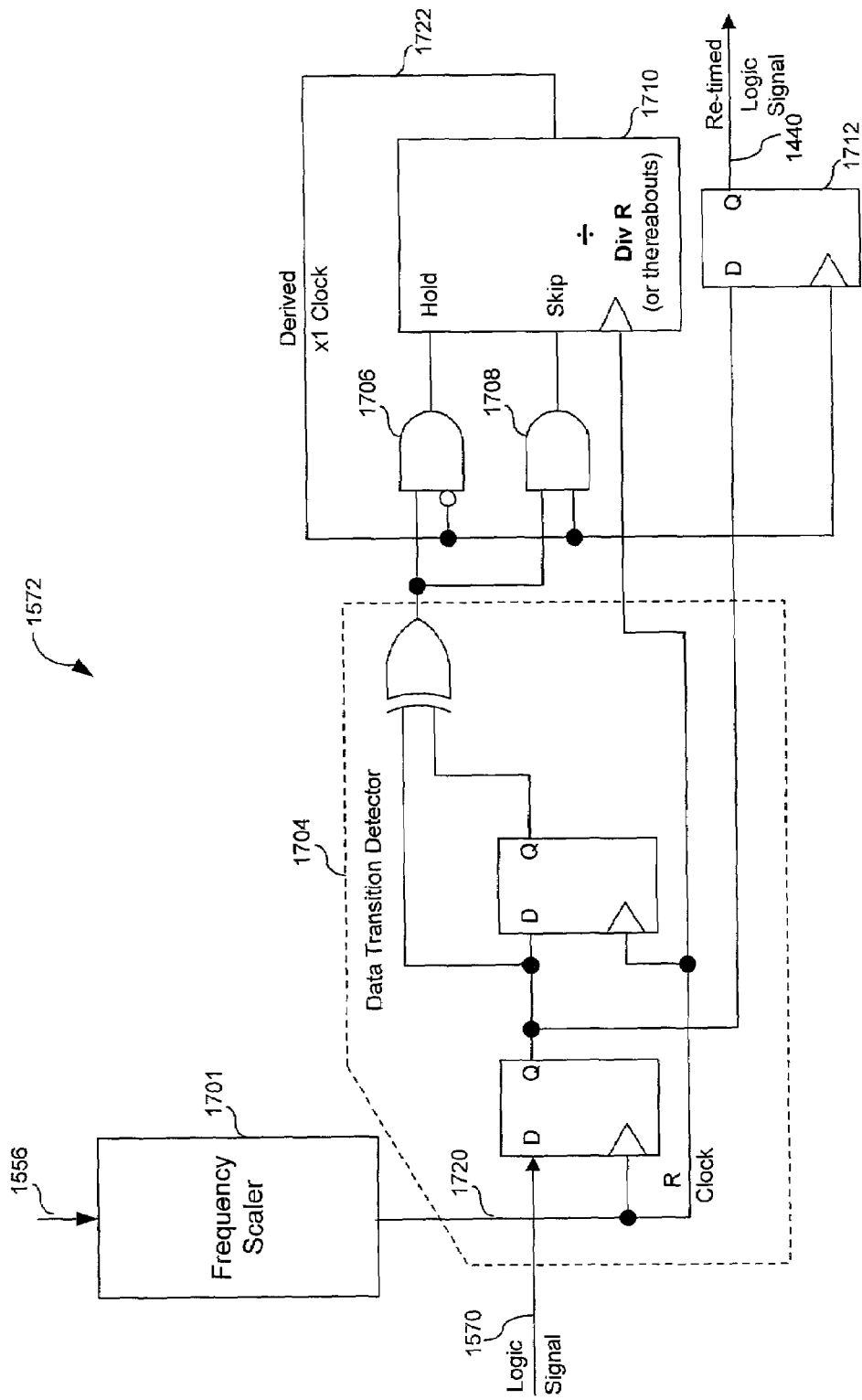
FIG. 17 is a block diagram expanding on a synchronizer of FIG. 15, in accordance with an embodiment of the present invention.

With reference again to FIG. 15, data synchronizer 1572 synchronizes or re-times logic signal 1570 with a re-synchronizing clock derived from oscillator 1552. FIG. 17 is a block diagram expanding on synchronizer 1572, in accordance with an embodiment of the present invention. Synchronizer 1572 includes a frequency scaler/divider 1701, a logic signal transition/edge detector 1704, first and second logic (AND) gates 1706 and 1708, a divider/counter 1710 and an output D-type flip-flop 1712. Frequency scaler 1701 divides-down the frequency of clock 1556 by a programmable number R, to produce a ×R clock 1720 (that is, the period of clock 1720 is R times longer than the period of clock 1556). Also, divider 1710 divides-down the frequency of clock 1720 by R, nominally, to produce a stable clock 1722 (referred to above as the re-synchronizing clock, and also referred to below as a ×1 clock, as distinguished from ×R clock 1720). In the embodiment depicted in FIG. 17, R=256.

Transition detector 1704, logic gates 1706 and 1708, and divider 1710 operate as a PLL to derive stable re-synchronizing clock 1722. Transition detector 1704 and logic gates 1706 and 1708 adjust the phase of ×1 clock 1722 such that the clock has consecutive positive going clock edges (that is, rising edges) aligned with the nominal middle portions of corresponding consecutive logic bits included in logic signal 1570. Derived re-synchronizing clock 1722 will normally include much less timing jitter than logic signal 1570, and can therefore be used as a re-synchronizing clock to advantageously reduce the timing jitter on logic signal 1570. This process becomes increasingly more useful as logic signal 1570 degrades in low signal-to-noise environments.

In operation, ×256 clock 1720 drives divider/counter 1710 (which can be an 8-bit binary counter when R=256) with both a "skip" and a "hold" capability, which effectively cause the count value to advance and retard by one from the present state, respectively The ×1 clock 1722 is produced by a most-significant-bit (MSB) output of counter 1710. Logic signal 1570 is sampled by the ×256 clock and any detected transitions are used to advance or retard the count of divider 1710 in such a way as to eventually result in the correct nominal alignment of the rising edges of the ×1 clock 1722 with the mid-point of logic bits included in logic signal 1570. The use of a ×256 clock rate gives a good compromise between jitter rejection capability against nominal alignment time.

Figure 18:
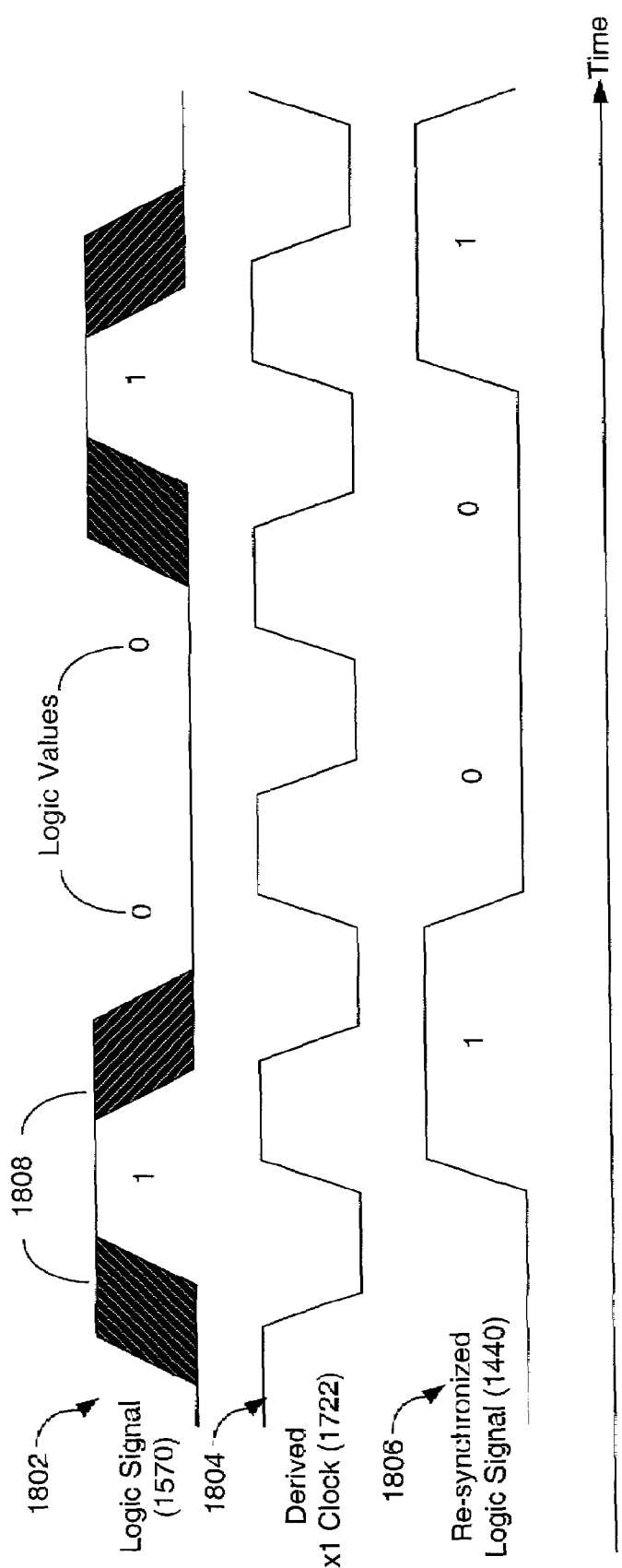
FIG. 18 is an illustration of several example timing diagrams of corresponding signals associated with the synchronizer of FIG. 17.

FIG. 18 is an illustration of several timing diagrams for several corresponding signals described above in connection with FIG. 17. An upper timing diagram 1802 represents an example portion of logic signal 1570, including timing jitter 1808.

A middle timing diagram 1804 represents an example portion of ×1 clock 1722. Clock 1722 includes rising edges coinciding with the middle portions of the logic bits (indicated as "1" or "0") included in logic signal 1570.

A lower timing diagram 1806 represents an example portion of re-synchronized logic signal 1440. Re-timing of logic signal 1570 with clock 1722 (for example, by latching consecutive logic states of logic signal 1570 with corresponding consecutive rising-edges of clock 1722) substantially eliminates timing jitter 1808 in re-synchronized logic signal 1440.

Figure 19A:
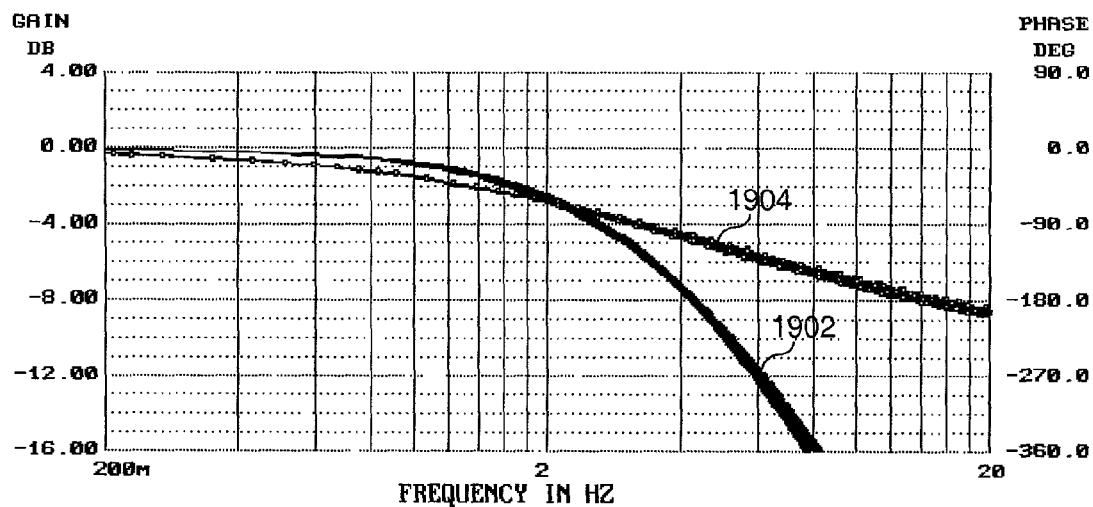
FIGS. 19A–19C are illustrations of example attenuation and phase versus frequency plots (that is, filter responses) for a lowpass filter used in the subsystem depicted in FIG. 15.
Figure 19B:
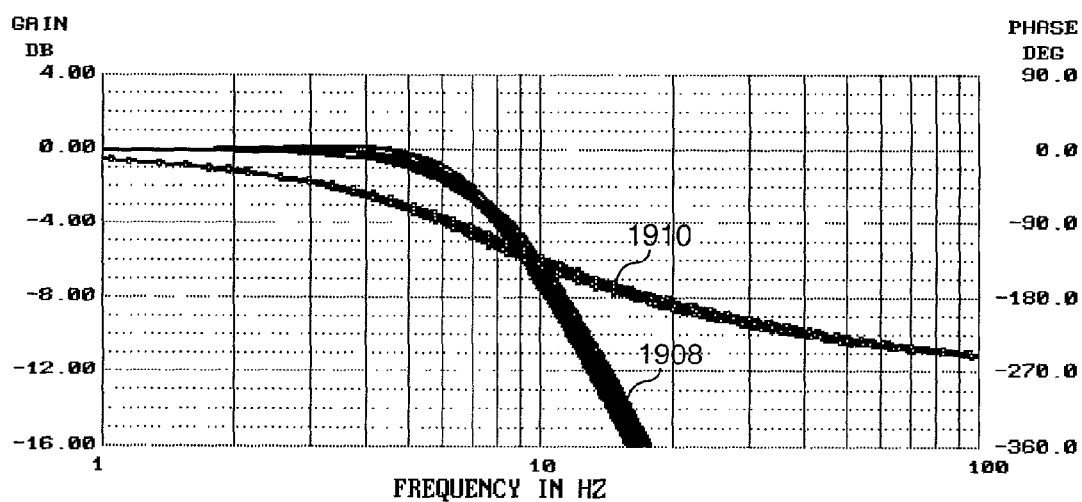
Figure 19C:
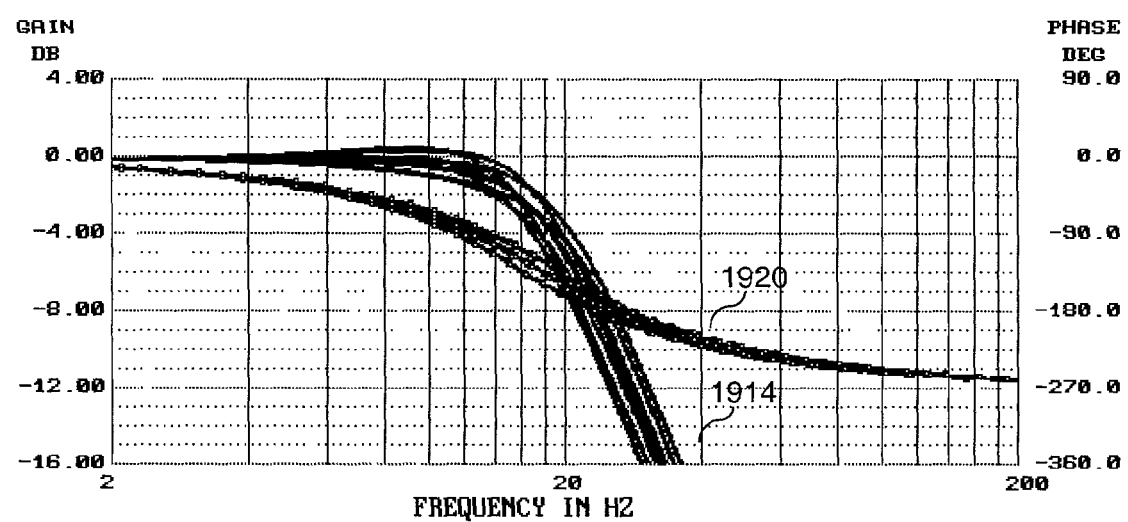

FIGS. 19A–19C are illustrations of frequency responses for PLL LPF 1520, described above in connection with FIG. 15. FIG. 19A is an illustration of an example attenuation-frequency plot 1902 and an example phase-frequency plot 1904 for PLL LPF 1520.

FIG. 19B is an illustration of another example attenuation-frequency plot 1908 and another example phase-frequency plot 1910 for LPF 1520.

FIG. 19C is an illustration of still another example attenuation-frequency plot 1914 and still another example phase-frequency plot 1920 for LPF 1520.

Figure 20:
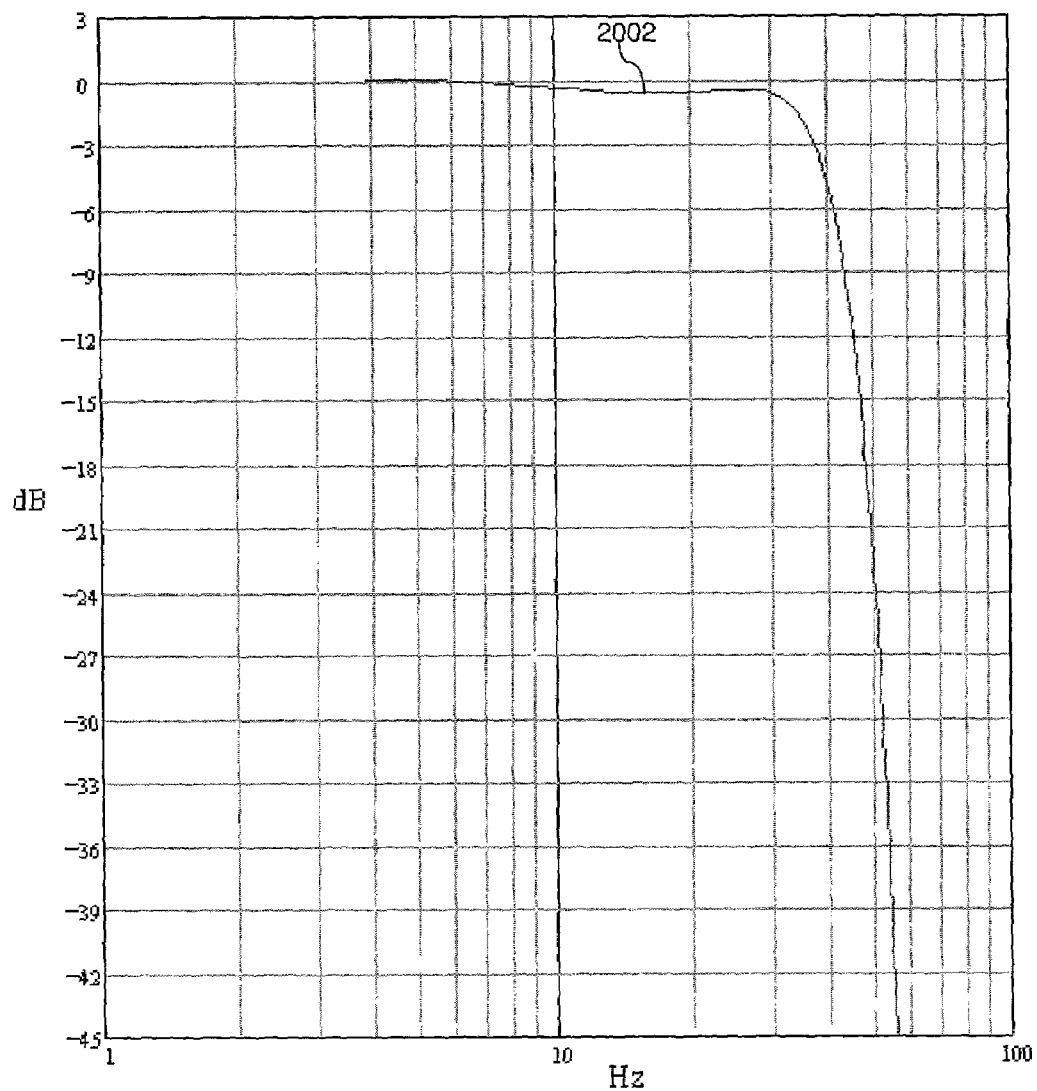
FIG. 20 is an example attenuation-frequency plot for a baseband lowpass filter used in the circuit depicted in FIG. 15.

FIG. 20 is an example attenuation-frequency plot 2002 for LPF 1542.

Figure 21:
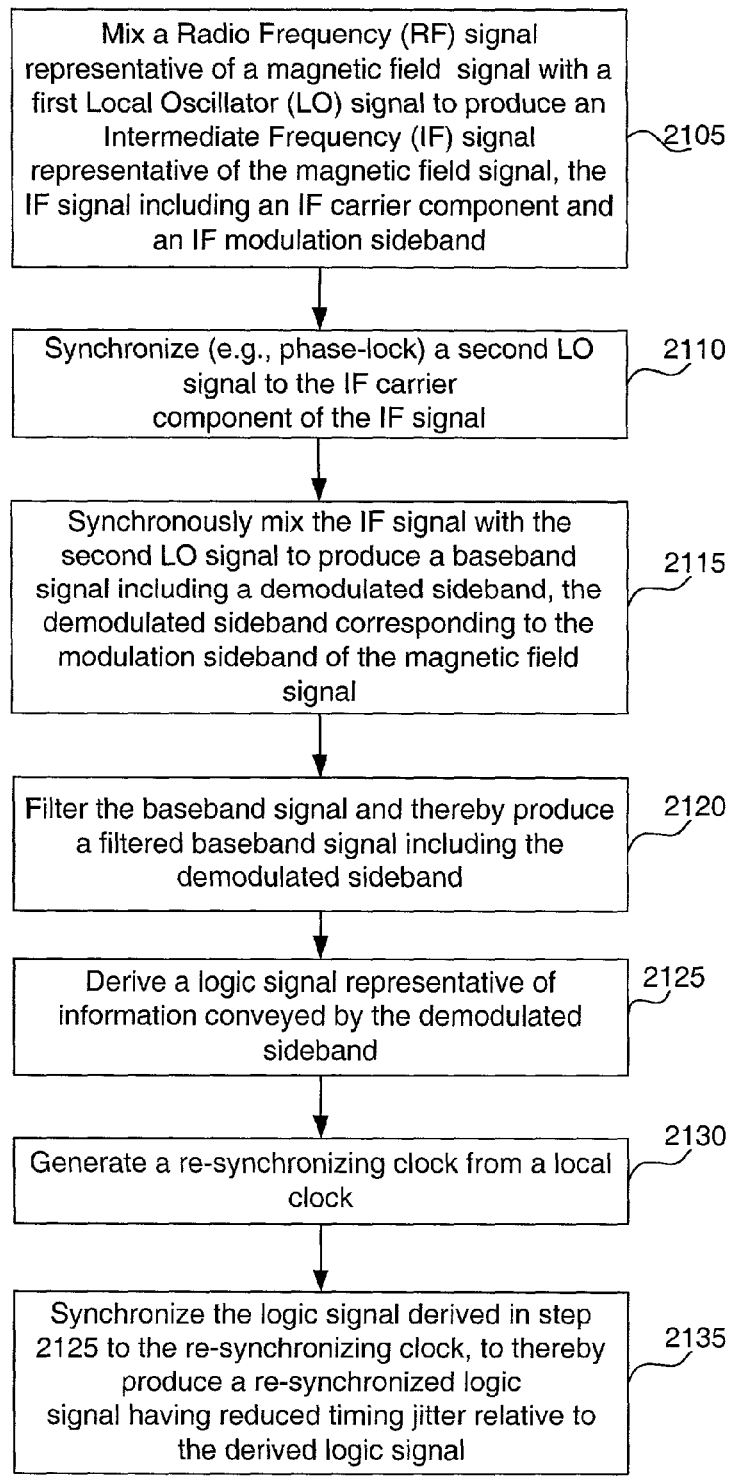
FIG. 21 is a flow chart of an example method of recovering data from a magnetic field signal.

FIG. 21 is a flow chart of an example method 2100 of recovering data from a received magnetic field signal, the magnetic field signal including a carrier component usable for locating an underground object and at least one modulation sideband. The magnetic field signal is received, for example, at receive device 110.

In a first step 2105, an RF signal representative of a magnetic field signal is mixed with a first LO signal to produce an IF signal representative of the magnetic field signal. The IF signal includes an IF carrier component and an IF modulation sideband.

In a next step 2110, a second LO signal is synchronized (for example, phase-locked) to the IF carrier component of the IF signal.

In a next step 2115, the IF signal is synchronously mixed with the second LO signal to produce a baseband signal including a demodulated sideband(s). The demodulated sideband(s) corresponds to the modulation sideband(s) of the magnetic field signal.

In a next step 2120, the baseband signal is filtered to thereby produce a filtered baseband signal including the demodulated sideband(s).

In a next step 2125, a logic signal representative of information conveyed by the demodulated sideband is derived from the filtered baseband signal.

In a next step 2130, a re-synchronizing clock is generated from a local clock.

In a next step 2135, the logic signal derived in step 2125 is synchronized to the re-synchronized clock, to thereby produce a re-synchronized logic signal having reduced timing jitter relative to the derived logic signal.

Figure 22:
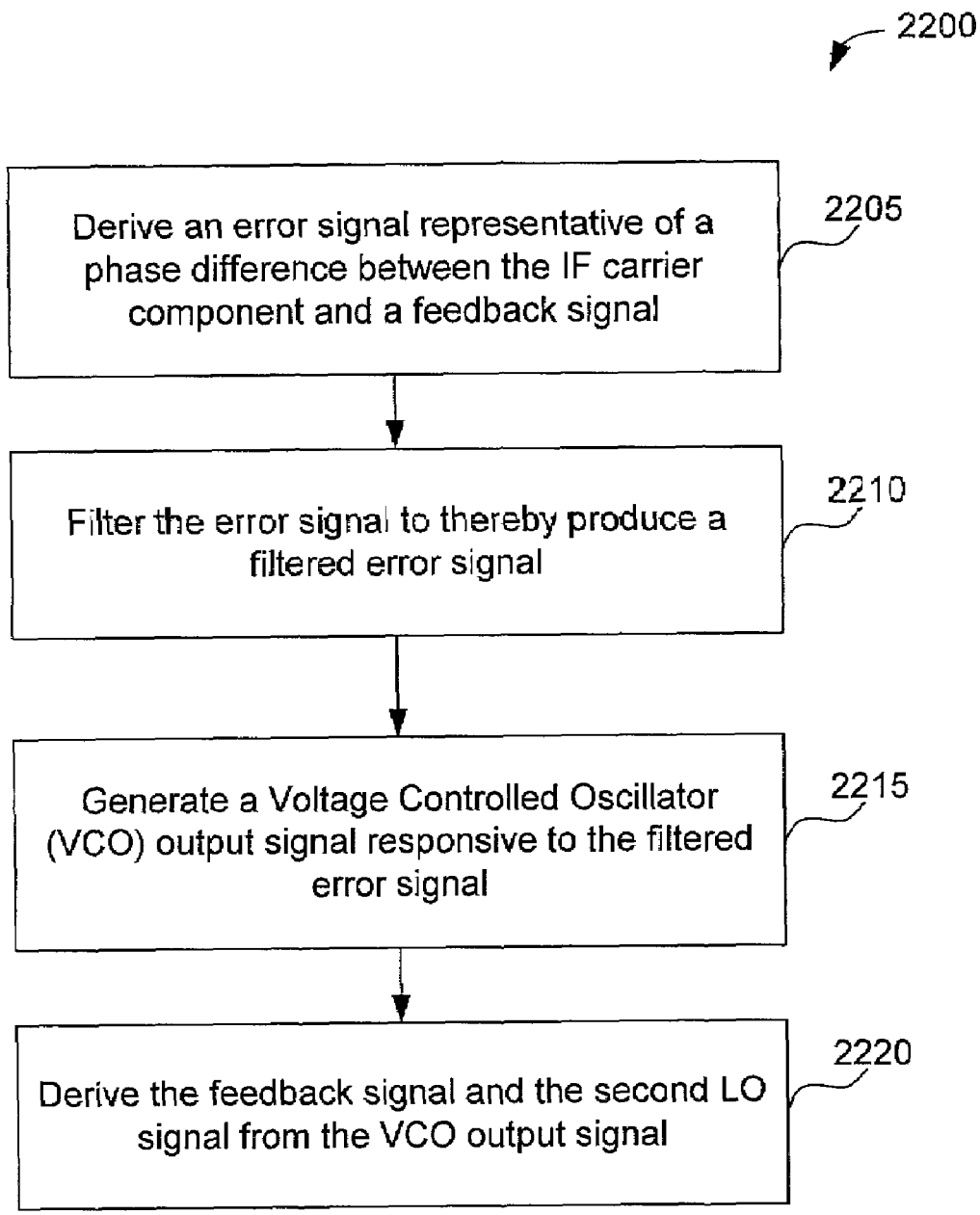
FIG. 22 is a flow chart of an example method expanding on the method of FIG. 21.

FIG. 22 is a flow chart of an example method 2200 expanding on method step 2110. In a first step 2205, an error signal representative of a phase difference between the IF carrier component (from step 2105) and a feedback signal is derived.

In a next step 2210, the error signal is filtered to thereby produce a filtered error signal.

In a next step 2215, a VCO output signal is generated responsive to the filtered error signal.

In a next step 2220, the feedback signal (used at step 2205) and the second LO signal (used at step 2110) are derived from the VCO output signal.

CONCLUSION

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention. For example, some embodiments of the present invention have been described as methods with reference to flow charts. The present invention is also directed to systems that perform the features discussed above. For example, the present invention is also directed to hardware and/or software that performs specific features of the present invention. Additionally, the present invention is also directed to a transmit device and receive devices that include hardware and/or software for performing such features. Other embodiments of the present invention are directed to transmitted magnetic field signals and/or systems for transmitting such signals.

Embodiments of the present invention have also been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by the above-described exemplary embodiments, but should be defined in accordance with the following claims and their equivalents.

What is claimed is:

1. A data recovery subsystem for use in a receive system configured to receive a magnetic field signal including a carrier component usable for locating an underground object and at least one modulation sideband, the data recovery subsystem comprising:

a first mixer adapted to mix a Radio Frequency (RF) signal representative of the magnetic field signal with a first Local Oscillator (LO) signal to produce an Intermediate Frequency (IF) signal representative of the magnetic field signal, the IF signal including an IF carrier component and an IF modulation sideband;

a Phase Locked Loop (PLL) adapted to phase-lock a second LO signal to the IF carrier component of the IF signal;

a second mixer adapted to synchronously mix the IF signal with the second LO signal to produce a baseband signal including a demodulated sideband, the demodulated sideband corresponding to the modulation sideband of the magnetic field signal a baseband filter adapted to filter the baseband signal and thereby produce a filtered baseband signal including the demodulated sideband;

a signal squarer following the baseband filter and adapted to derive a logic signal from the filtered baseband signal, the logic signal being representative of information conveyed by the demodulated sideband a local oscillator for generating a local clock; and a data synchronizer adapted to derive a stable re-synchronizing clock from the local clock, and synchronize the logic signal to the re-synchronizing clock, thereby producing a re-synchronized logic signal having reduced timing jitter relative to the logic signal.

2. The subsystem of claim 1, wherein the PLL includes a Voltage Controlled Oscillator (VCO) adapted to generate a VCO output signal that is phase-locked to the IF carrier component of the IF signal, the subsystem further comprising a feedback circuit adapted to derive the first LO signal from the VCO output signal, whereby the first LO signal is also phase-locked to the IF carrier component of the IF signal.

3. The subsystem of claim 1, wherein:

the RF signal includes an RF carrier component having an RF carrier frequency substantially equal to an integer multiple of both 50 Hz and 60 Hz; and the RF signal includes an RF modulation sideband having sideband energy, a substantial portion of the sideband energy being contained between the RF carrier frequency and a frequency spaced 50 Hz from the carrier frequency.

4. The subsystem of claim 1, wherein the PLL includes:

a PLL mixer adapted to derive an error signal representative of a phase difference between the IF carrier component of the IF signal and a feedback signal;

a filter adapted to filter the error signal to thereby produce a filtered error signal;

a Voltage Controlled Oscillator (VCO) adapted to generate a VCO output signal responsive to the filtered error signal; and a feedback circuit adapted to derive the feedback signal and the second LO signal from the VCO output signal.

5. The subsystem of claim 4, further comprising a second feedback circuit adapted to derive the first LO signal from the VCO output signal, whereby the first LO signal is also phase-locked to the IF carrier component of the IF signal.

6. The subsystem of claim 1, further comprising:
a baseband filter adapted to filter the baseband signal and thereby produce a filtered baseband signal including the demodulated sideband; and
a signal squarer following the baseband filter and adapted to derive a logic signal from the filtered baseband signal, the logic signal being representative of information conveyed by the demodulated sideband.

7. The subsystem of claim 6, further comprising:
a local oscillator for generating a local clock; and
a data synchronizer adapted to
derive a stable re-synchronizing clock from the local clock, and
synchronize the logic signal to the re-synchronizing clock, thereby producing a re-synchronized logic signal having reduced timing jitter relative to the logic signal.

8. The subsystem of claim 1, wherein the demodulated sideband has a −3 dB frequency bandwidth defined between a lower sideband frequency and an upper sideband frequency, the lower sideband frequency being frequency-offset from zero Hz and the upper sideband frequency being less than 50 Hz.

9. The subsystem of claim 8, wherein the baseband filter has a bandpass filter characteristic including
a passband bandwidth coinciding with the predetermined bandwidth of the demodulated sideband, and
lower and upper stopband regions to respectively attenuate frequencies at zero and 50 Hz.

10. The subsystem of claim 9, wherein the baseband filter includes a lowpass filter to substantially attenuate frequencies equal to and above 50 Hz.

11. The subsystem of claim 9, wherein the filter includes a $10^{th}$ order, linear phase, lowpass filter.

12. A method of recovering data from a magnetic field signal, the magnetic field signal including a carrier component usable for locating an underground object and at least one modulation sideband, the method comprising:
(a) mixing a Radio Frequency (RF) signal representative of the magnetic field signal with a first Local Oscillator (LO) signal to produce an Intermediate Frequency (IF) signal representative of the magnetic field signal, the IF signal including an IF carrier component and an IF modulation sideband;
(b) phase-locking a second LO signal to the IF carrier component of the IF signal;
(c) synchronously mixing the IF signal with the second LO signal to produce a baseband signal including a demodulated sideband, the demodulated sideband corresponding to the modulation sideband of the magnetic field signal; and filtering the baseband signal to thereby produce a filtered baseband signal including the demodulated sideband; and deriving a logic signal representative of information conveyed by the demodulated sideband.

13. The method of claim 12, further comprising phase-locking the first LO signal to the IF carrier component of the IF signal.

14. The method of claim 12, wherein:
the RF signal includes an RF carrier component having an RF carrier frequency substantially equal to an integer multiple of both 50 Hz and 60 Hz; and
the RF signal includes an RF modulation sideband having sideband energy, a substantial portion of the sideband energy being contained between the RF carrier frequency and a frequency spaced 50 Hz from the carrier frequency.

15. The method of claim 12, wherein step (b) comprises:
deriving an error signal representative of a phase difference between the IF carrier component and a feedback signal;
filtering the error signal to thereby produce a filtered error signal;
generating a Voltage Controlled Oscillator (VCO) output signal responsive to the filtered error signal; and
deriving the feedback signal and the second LO signal from the VCO output signal.

16. The method of claim 15, further comprising deriving the first LO signal from the VCO output signal, whereby the first LO signal is phase-locked to the IF carrier component.

17. The method of claim 12, further comprising:
filtering the baseband signal to thereby produce a filtered baseband signal including the demodulated sideband; and
deriving a logic signal representative of information conveyed by the demodulated sideband.

18. The method of claim 12, further comprising:
generating a re-synchronizing clock from a local clock; and
synchronizing the logic signal to the re-synchronizing clock to thereby produce a re-synchronized logic signal having reduced timing jitter relative to the logic signal.

19. The method of claim 18, wherein the demodulated sideband has a frequency bandwidth defined between a lower sideband frequency and an upper sideband frequency, the lower sideband frequency being frequency-offset from zero Hz and the upper sideband frequency being less than 50 Hz.

20. The method of claim 19, wherein said filtering step includes bandpass filtering the baseband signal to
pass the demodulated sideband to the deriving step with relatively little attenuation of the demodulated sideband,
substantially attenuate frequencies at or near zero Hz, and
substantially attenuate frequencies equal to and above 50 Hz.

* * * * *